US009397294B2

(12) United States Patent
Brown et al.

(10) Patent No.: US 9,397,294 B2
(45) Date of Patent: Jul. 19, 2016

(54) VERTICALLY PHASE-SEPARATING SEMICONDUCTING ORGANIC MATERIAL LAYERS

(75) Inventors: Christopher T. Brown, Pittsburgh, PA (US); Neetu Chopra, Pittsburgh, PA (US); Venkataramanan Seshadri, Monroeville, PA (US); Jing Wang, Gibsonia, PA (US)

(73) Assignee: SOLVAY USA, INC., Cranbury, NJ (US)

( * ) Notice: Subject to any disclaimer, the term of this patent is extended or adjusted under 35 U.S.C. 154(b) by 940 days.

(21) Appl. No.: 13/539,134

(22) Filed: Jun. 29, 2012

(65) Prior Publication Data

US 2013/0009137 A1    Jan. 10, 2013

Related U.S. Application Data

(60) Provisional application No. 61/504,653, filed on Jul. 5, 2011.

(51) Int. Cl.
| H01L 51/54 | (2006.01) |
| H01L 51/00 | (2006.01) |
| C08L 65/00 | (2006.01) |
| C08K 5/18 | (2006.01) |
| H01L 51/50 | (2006.01) |

(52) U.S. Cl.
CPC .............. *H01L 51/0003* (2013.01); *C08K 5/18* (2013.01); *C08L 65/00* (2013.01); *C08G 2261/1424* (2013.01); *C08G 2261/3162* (2013.01); *C08G 2261/3223* (2013.01); *C08G 2261/51* (2013.01); *C08L 2205/02* (2013.01); *H01L 51/0059* (2013.01); *H01L 51/5056* (2013.01); *H01L 51/5064* (2013.01); *H01L 51/5088* (2013.01); *H01L 2251/552* (2013.01)

(58) Field of Classification Search
None
See application file for complete search history.

(56) References Cited

U.S. PATENT DOCUMENTS

| 4,356,429 A | 10/1982 | Tang |
| 4,539,507 A | 9/1985 | VanSlyke et al. |
| 4,737,557 A | 4/1988 | Sato et al. |
| 4,909,959 A | 3/1990 | Lemaire et al. |
| 5,047,687 A | 9/1991 | VanSlyke |
| 5,247,190 A | 9/1993 | Friend et al. |
| 5,401,827 A | 3/1995 | Holmes et al. |
| 5,454,880 A | 10/1995 | Sariciftci et al. |
| 5,853,906 A | 12/1998 | Hsieh |
| 5,999,780 A | 12/1999 | Mort et al. |
| 6,166,172 A | 12/2000 | McCullough et al. |
| 6,602,974 B1 | 8/2003 | McCullough et al. |
| 6,812,399 B2 | 11/2004 | Shaheen et al. |
| 6,933,436 B2 | 8/2005 | Shaheen et al. |
| 7,070,867 B2 | 7/2006 | Thompson et al. |
| 7,569,159 B2 | 8/2009 | Hammond et al. |
| 2004/0113127 A1 | 6/2004 | Min et al. |
| 2005/0123793 A1 | 6/2005 | Thompson et al. |
| 2005/0147846 A1 | 7/2005 | Marks et al. |
| 2006/0076050 A1 | 4/2006 | Williams et al. |
| 2006/0078761 A1 | 4/2006 | Williams et al. |
| 2007/0207341 A1 | 9/2007 | Iida et al. |
| 2008/0248313 A1 | 10/2008 | Seshadri et al. |
| 2009/0230361 A1 | 9/2009 | Seshadri et al. |
| 2009/0256117 A1 | 10/2009 | Seshadri et al. |
| 2010/0043876 A1 | 2/2010 | Tuttle et al. |
| 2010/0072462 A1 | 3/2010 | Brown et al. |
| 2010/0108954 A1 | 5/2010 | Benson-Smith et al. |
| 2010/0109000 A1 | 5/2010 | Mathai et al. |
| 2010/0292399 A1 | 11/2010 | Brown et al. |
| 2011/0147725 A1 | 6/2011 | Seshadri |
| 2012/0001127 A1 | 1/2012 | Brown et al. |
| 2012/0003790 A1 | 1/2012 | Brown et al. |

FOREIGN PATENT DOCUMENTS

| EP | 1 725 079 A1 | 11/2006 | |
| JP | 2000048959 A * | 2/2000 | ............ H05B 33/14 |
| WO | WO-2009/102027 A1 | 8/2009 | |
| WO | WO-2009/111339 A1 | 9/2009 | |
| WO | WO-2009/111675 A1 | 9/2009 | |
| WO | WO-2009/152165 A2 | 12/2009 | |
| WO | WO-2009/158069 A1 | 12/2009 | |
| WO | WO-2010/062558 A1 | 6/2010 | |

(Continued)

OTHER PUBLICATIONS

Machine translation of JP2000-048959. Date of publication: Feb. 18, 2000.*
"Indium Tin Oxide and Alternative Transparent Conductor Markets," 2009, NanoMarkets, LC., www.nanomarkets.net.
Ahmed et al., "New Solution-Processable Electron Transport Materials for Highly Efficient Blue Phosphorescent OLEDs," 2011, Advanced Functional Materials, vol. 21, 3889-3899, Wiley-VCH Verlag GmbH & Co. KGaA, Weinheim.
Anthopoulos et al., "Highly efficient single-layer dendrimer light-emitting diodes with balanced charge transport," 2003, vol. 82, No. 26, pp. 4824-4826, American Institute of Physics.

(Continued)

*Primary Examiner* — Andrew K Bohaty
(74) *Attorney, Agent, or Firm* — The Marbury Law Group, PLLC

(57) ABSTRACT

Improved OLED devices and methods of making the same using vertical phase separation to simplify processing. Vertically phase separated material can include at least one lower first layer disposed on the electrode, and at least one upper second layer different from the first layer and disposed away from the electrode or optionally on one layer comprising at least one semiconducting organic material. The first layer can be enriched with at least one first semiconducting organic material (SOM 1) and the second layer can be enriched with at least one second semiconducting organic material (SOM 2) different from the SOM 1. The ink composition can be adapted so that the film vertically phase separates into the first and second layers. Compositions and devices are also embodied herein.

18 Claims, 1 Drawing Sheet

(56) References Cited

FOREIGN PATENT DOCUMENTS

| | | |
|---|---|---|
| WO | WO-2011/049904 A2 | 4/2011 |
| WO | WO-2011/049953 A2 | 4/2011 |

OTHER PUBLICATIONS

Arias et al., "Photovoltaic Performance and Morphology of Polyfluorene Blends: A combined Microscopic and Photovoltaic Investigation," Macromolecules, 2001, 34, pp. 6005-6013.

Arias et al., "Vertically segregated polymer-blend photovoltaic thin-film structures through surface-mediated solution processing," Appl. Phys. Lett., 2002, vol. 80, No. 10, pp. 1695-1697.

Arias, A.C., "Vertically Segregated Polymer Blends: Their Use in Organic Electronics," Journal of Macromolecular Science, Part C: Polymer Reviews, 2006, vol. 46, pp. 103-125, Taylor & Francis.

Ash, Handbook of Solvents, 2nd Ed., Synapse Information Resources, 2003, 3 pages. (Table of Contents).

Baldo et al., "Transient analysis of organic electrophosphorescence: I. Transient analysis of triplet energy transfer," Phys. Rev. B, 2000, vol. 62, No. 16, pp. 10958-10966, The American Physical Society.

Brédas et al., "Conjugated Polymers, The Novel Science and Technology of Highly Conducting and Nonlinear Optically Active Materials," 1991, Kluwer Academic Press, Dordrecht. (Table of Contents).

Campos et al., "Photovoltaic Activity of a PolyProDOT Derivative in a Bulk Heterojunction Solar Cell," Solar Energy Materials & Solar Cells, 2006, vol. 90, pp. 3531-3546, Elsevier B.V.

Cheremisinoff, "Industrial Solvents Handbook," 2003, 2nd Ed., Marcel Dekker, Inc., New York.

Cho et al., "Cyclopenta[def]fluorene based high triplet energy hole transport material for blue phosphorescent organic light-emitting diodes," Organic Electronics, 2012, vol. 13, pp. 1044-1048, Elsevier B.V.

Cho et al., "Low Driving Voltage, High Quantum Efficiency, High Power Efficiency, and Little Efficiency Roll-Off in Red, Green, and Deep-Blue Phosphorescent Organic Light-Emitting Diodes Using a High-Triplet-Energy Hole Transport Material," Advanced Materials, 2011, vol. 23, pp. 4568-4572, Wiley-VCH Verlag GmbH & Co., KGaA, Weinheim.

Coe-Sullivan et al., "Large-Area Ordered Quantum-Dot Monolayers via Phase Separation During Spin-Casting," Adv. Func. Mater., 2005, vol. 15, pp. 1117-1124, Wiley-VCH Verlag GmbH & Co. KGaA, Weinheim.

Corcoran et al., "Increased efficiency in vertically segregated thin-film conjugated polymer blends for light-emitting diodes," App. Phys. Lett., 2003, vol. 82, No. 2, pp. 299-301.

Duan et al., "Solution processable small molecules for organic light-emitting diodes," Journal of Materials Chemistry, 2010, vol. 20, 6392-6407, The Royal Society of Chemistry.

Francois et al., "Block-copolymers with conjugated segments: Synthesis and structural characterization," Synthetic Metals, 1995, vol. 69, 463-466, Elsevier Science S.A.

Friend et al., "Electroluminescence in Conjugated Polymers," Handbook of Conducting Polymers, 2nd Ed., 1998, Chapter 29, 823-845, Marcel Dekker, Inc.

Friend et al., "Polymer LEDs," Physics World, 1992, vol. 5, No. 11, pp. 42-46.

Greczynski et al., "Characterization of the PEDOT-PSS system by means of X-ray and Ultraviolet Photoelectron Spectroscopy," Thin Solid Films, 1999, vol. 354, pp. 129-135, Elsevier Science S.A.

Hamilton et al., "High-Performance Polymer-Small Molecule Blend Organic Transistors," Advanced Materials, 2009, vol. 21, pp. 1166-1171, Wiley-VCH Verlag GmbH & Co., KGaA, Weinheim.

Hansen et al., "Hansen Solubility Parameters: A User's Handbook, Second Edition," Taylor and Francis Group, 2007, 9 pages, CRC Press. (Table of Contents).

Hempenius et al., "A Polystyrene-Oligothiophene-Polystyrene Triblock Copolymer," J Am. Chem., Soc., 1998, vol. 120, pp. 2798-2804, American Chemical Society.

Heriot et al., "An interfacial instability in a transient wetting layer leads to lateral phase separation in thin spin-cast polymer-blend films," Nature Materials, 2005, vol. 4, Nature Publishing Group.

Hijazi et al., "Synthesis and Characterization of Acetonitrile-Ligated Transition-Metal Complexes with Tetrakis(pentafluorophenyl)borate as Counteranions," European Journal Inorganic Chemistry, 2008, pp. 2892-2898, Wiley-VCH Verlag GmbH & Co. KGaA, Weinheim.

Hwang J., "Spectroscopic study on sputtered PEDOT-PSS: Role of surface PSS layer," Organic Electronics, 2006, vol. 7, 387-396, Elsevier B.V.

International Search Report and Written Opinion issued in PCT/US2012/045066 dated Dec. 4, 2012, 12 pages.

Jenekhe et al., "Self-Assembled Aggregates of Rod-Coil Block Copolymers and Their Solubilization and Encapsulation of Fullerenes," Science, 1998, vol. 279, pp. 1903-1907.

Jeon et al., "100% internal quantum efficiency and stable efficiency roll-off in phosphorescent light-emitting diodes using a high triplet energy hole transport material," Applied Physics Letters, 2008, vol. 93, 063306/1-063306/3, American Institute of Physics.

Katz et al., "Synthetic Chemistry for Ultrapure, Processable, and high-Mobility Organic Transistor Semiconductors," Accounts of Chemical Research, 2001, vol. 34. No. 5, pp. 359-369, American Chemical Society.

Kim et al., "Improved power efficiency in deep blue phosphorescent organic light-emitting diodes using an acridine core based hole transport material," Organic Electronics, 2012, vol. 13, 1245-1249, Elsevier B.V.

Kim et al., "Mixing effect of hole-injecting and hole transporting materials on the performance and lifetime of organic light-emitting devices," App. Phys. Lett., 2006, vol. 88, pp. 043504-1-043504-3, American Institute of Physics.

Kondakova et al., "High-efficiency, low-voltage phosphorescent organic light-emittting diode devices with mixed host," Journal of Applied Physics, 2008, vol. 104, pp. 094501-1-094501-17, American Institute of Physics.

Kraft, et al., "Electroluminescent Conjugated Polymers—Seeing Polymers in a New Light," Angew. Chem., Int. Ed., 1998, 37, 402-428, Wiley-VCH Verlag GmbH, D-69451 Weinheim.

Kroschwitz, "Electrically Conductive Polymers," Concise Encyclopedia of Polymer Science and Engineering, 1990, 298-300, John Wiley & Sons, Inc.

Kuprat et al., "Synthesis of Pentafluorophenyl Silver by Means of Lewis Acid Catalysis: Structure of Silver Solvent Complexes," Organometallics, 2010, vol. 29, pp. 1421-1427, American Chemical Society.

Li et al., "Organic Light-Emitting Materials and Devices," 2007, Taylor & Francis Group. (Table of Contents).

Li et al., "Syntheses of Oligophenylenevinylenes—Polyisoprene Diblock Copolymers and Their Microphase Separation," Macromolecules, 1999, vol. 32, pp. 3034-3044, American Chemical Society.

McCullough et al., "Regioregular, Head-to-Tail Coupled Poly(3-alkylthiophene) and its Derivatives," Handbook of Conducting Polymers, 1998, 2nd Ed., pp. 225-258, Marcel Dekker, Inc.

McCullough, "The Chemistry of Conducting Polythiophenes," Advanced Materials, 1998, vol. 10, No. 2, pp. 93-116, Wiley-VCH Verlag GmbH, D-69469 Weinheim.

Mikhnenko et al., "Direct Measurement of the Triplet Exciton Diffusion Length in Organic Semiconductors," Physical Review Letters, 2012, vol. 108, pp. 137401-1-137401-5, American Physical Society.

Montalti et al., Handbook of Photochemistry, 2006, 3rd edition, Taylor & Francis. (Table of Contents).

Nielsen et al., "Discrete Photopattemable π-conjugate Oligomers for Electrochromic Devices," J. Am. Chem. Soc., 2008, vol. 130, pp. 9734-9746, American Chemical Society.

Noshay et al., "Block Copolymers, Overview and Critical Survey," 1977, Chapters 5, 6 and 7, Academic Press. (Table of Contents).

Ogawa et al, "Synthesis and Structure of a New Tetrakis(pentafluorophenyl)borate Salt of the Silver(I) Cation with Novel Trigonal Planar Tris(benzene) Coordination," Organometallics, 2005, vol. 24, pp. 4842-4844, American Chemical Society.

(56) References Cited

OTHER PUBLICATIONS

Park et al., "Fused indole derivatives as high triplet energy hole transport materials for deep blue phosphorescent organic light-emitting diodes," J. Mater. Chem., 2012, vol. 22, pp. 3099-3104, The Royal Society of Chemistry.

Park et al., "Indolo Acridine-Based Hole-Transport Materials for Phosphorescent OLEDs with Over 20% External Quantum Efficiency in Deep Blue and Green," Chemistry of Materials 2011, vol. 23, pp. 4338-4343, American Chemical Society, ACS Publications.

Roncali, "Conjugated Poly(thiophenes): Synthesis, Functionalization, and Applications," Chem. Rev., 1992, vol. 92, pp. 711-738, American Chemical Society.

Sasabe et al., "Multifunctional Materials in High-Performance OLEDs: Challenges for Solid-State Lighting," Chemistry of Materials, Review, 2011, vol. 23, pp. 621-630, American Chemical Society.

Schopf et al., "Polythiophenes—Electrically Conductive Polymers," 1997, 4 pages, Springer, Berlin. (Table of Contents).

Shirota et al., "Charge Carrier Transporting Molecular Materials and Their Applications in Devices," Chem. Rev., 2007, vol. 107, pp. 953-1010, American Chemical Society.

So, "Organic Electronics: Materials, Processing, Devices and Applications," 2010, 3 pages, CRC Press. (Table of Contents).

Sun et al., "Vertically segregated hybrid blends for photovoltaic devices with improved efficiency," J Appl. Phys., 2005, 97, pp. 014914-1-014914-6, American Institute of Physics.

Tao et al., "Organic host materials for phosphorescent organic light-emitting diodes," Chemical Society Reviews, 2011, vol. 40, No. 5, pp. 2943-2970, The Royal Society of Chemistry.

Turro, "Modern Molecular Photochemistry," 1991, University Science Books, Mill Valley, California. (Table of Contents).

Ulbricht et al., "Recent Developments in the Application of Phosphorescent Iridium(III) Complex Systems," Advanced Materials, 2009, vol. 21, pp. 4418-4441, Wiley-VCH Verlag GmbH & Co. KGaA, Weinheim.

Walheim et al., "Structure Formation via Polymer Demixing in Spin-Cast Films," Macromolecules, 1997, vol. 30, pp. 4995-5003, American Chemical Society.

Wang et al., "Syntheses of Amphiphilic Diblock Copolymers Containing a Conjugated Block and Their Self-Assembling Properties," J. Am. Chem. Soc., 2000, vol. 122, pp. 6855-6861, American Chemical Society.

Widawski et al., "Self-organized honeycomb morphology of star-polymer polystyrene films," Letters to Nature 1994, vol. 369, pp. 387-389, Nature Publishing Group.

Wienk et al., "Low-band gap poly(di-2-thienylthienopyrazine):fullerene solar cells," Applied Physics Letters, 2006, vol. 88, pp. 153511-1-153511-3, American Institute of Physics.

Wunsche et al., "Measurement of triplet exciton diffusion in organic light-emitting diodes," Physical Review B, 2010, vol. 81, pp. 245201-1-245201-11, The American Physical Society.

Wypych, "Handbook of Solvents," 2001, ChemTec Publishing, William Andrew Publishing. (Table of Contents Only).

Yang et al., "A Soluble Blue-Light-Emitting Polymer," Macromolecules, Communications to the Editor, 1993, vol. 26, pp. 1188-1190, American Chemical Society.

Yersin et al., "Highly Efficient OLEDs with Phosphorescent Materials," 2008, 7 pages, Wiley-VCH Verlag GmbH & Co. KGaA, Weinheim. (Table of Contents).

Yim et al., "Phase-Separated Thin Film Structures for Efficient Polymer Blend Light-Emitting Diodes," Nano Letters, 2010, vol. 10, pp. 385-392, American Chemical Society.

Zhou et al., "Recent progress and current challenges in phosphorescent white organic light-emitting diodes (WOLEDs)," Journal of Photochemistry and Photobiology C: Photochemistry Reviews, 2010, vol. 11, pp. 133-156, Elsevier B.V.

Zou et al., "Metal grid/conducting polymer hybrid transparent electrode for inverted polymer solar cells," Appl. Phys. Lett., 2010, vol. 96, pp. 203301-1-203301-203301-3, American Institute of Physics.

\* cited by examiner

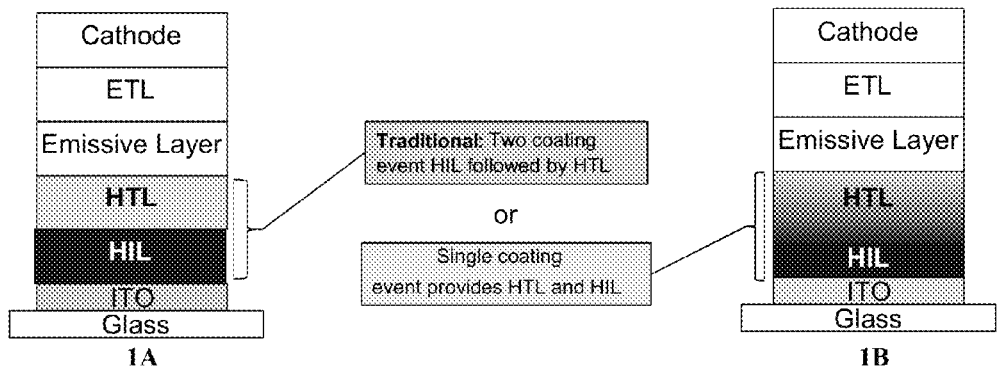

VERTICALLY PHASE-SEPARATING SEMICONDUCTING ORGANIC MATERIAL LAYERS

RELATED APPLICATIONS

This application claims priority to U.S. provisional application 61/504,653 filed Jul. 5, 2011, which is hereby incorporated by reference in its entirety.

BACKGROUND

Although useful advances are being made in energy saving devices such as organic-based organic light emitting diodes (OLEDs), polymer light emitting diodes (PLEDs), phosphorescent organic light emitting diodes (PHOLEDs), and organic photovoltaic devices (OPVs), further improvements are still needed in providing better processing and performance. For example, one promising type of material is the conjugated, conducting polymer including, for example, polythiophenes. However, problems can arise with doping, purity, solubility, and processing, particularly when complex architectures need to be fabricated by solution processing. In particular, it is important for solution processing to have very good control over the solubility of alternating layers of polymer (e.g., orthogonal or alternating solubility properties among adjacent layers).

In particular, for example, hole injection layers and hole transport layers can present difficult problems in view of competing demands and the need for very thin, but high quality, films.

A need exists for a good platform system to control properties of hole injection and transport layers such as solubility, thermal stability, and electronic energy levels such as HOMO and LUMO, so that the materials can be adapted for different applications and to function with different materials such as light emitting layers, photoactive layers, and electrodes. In particular, good solubility and intractability properties are important. The ability to formulate the system for a particular application and provide the required balance of properties is also important. Interfacial effects are important.

A need also exists to find simpler and less expensive methods to fabricate electronic devices including OLEDs.

SUMMARY

Embodiments described herein include, for example, compositions, methods of making the compositions, and methods of using the compositions, and devices and articles fabricated from the compositions. Compositions include for example polymers, monomers, blends, films, dispersions, solutions, and ink formulations.

One embodiment provides for a composition comprising: a first semiconducting organic material (SOM 1); a second semiconducting organic material (SOM 2) different from the SOM 1; at least one solvent system, wherein the SOM 1 and the SOM 2 are selected from the group consisting of (a) at least one hole injection material (HIM) and at least one hole transporting material (HTM) which is different than the hole injection material, (b) at least one first hole transporting material (HTM 1) and at least one second hole transporting material (HTM 2) which is different from the first hole transport material, or (c) at least one emissive material (EM) and at least one electron transporting material (ETM), respectively, and wherein the SOM 2 is functionalized to encourage surface enrichment of the SOM 2 away from a substrate when the solvent system is removed and a film is formed on the substrate. In one embodiment, the SOM 2 is functionalized with at least one perfluoro or at least one semi-fluoro alkyl chain or aryl group. In another embodiment, the SOM 2 has a molecular weight of about 2,000 g/mol or less. In another embodiment, the SOM 2 is a crosslinkable material. In another embodiment, the SOM 1 and the SOM 2 do not undergo charge transfer with mixing. In another embodiment, the solvent system comprises at least two different solvents, and the SOM 1, the SOM 2, and the solvent system are adapted so that the SOM 1 precipitates earlier than the SOM 2 upon removal of the solvent system.

In yet another embodiment, the solvent system comprises at least one polar solvent and at least one aromatic solvent. In another embodiment, the solvent system comprises at least two different solvents, and the SOM 1, the SOM 2, and the solvent system are adapted so that the SOM 1 precipitates earlier than the SOM 2 upon removal of the solvent system, wherein the SOM 2 is functionalized with a polar moiety. In another embodiment, the solvent system comprises at least two different solvents, and the SOM 1, the SOM 2, and the solvent system are adapted so that the SOM 1 precipitates earlier than the SOM 2 upon removal of the solvent system, wherein the SOM 2 is functionalized with a salt moiety. In another embodiment, the substrate is a flexible substrate.

In another set of embodiments, the SOM 1 is a hole injection material (HIM) and the SOM 2 is a hole transporting material (HTM) different from the hole injection material.

Some embodiments include wherein the hole transporting material is an arylamine and/or functionalized with at least one fluorinated group, at least one alkyl group, and/or at least one siloxyl group and/or functionalized with at least one perfluoro or at least one semi-fluoro alkyl chain or aryl group. In one embodiment, the composition comprises N4,N4'-bis(4-tidecafluorononyloxyphenyl)-N4,N4'-diphenyl-[1,1'-biphenyl]-4,4'-diamine; or N4,N4'-bis(4-vinylphenyl)-N4,N4'-diphenyl-[1,1'-biphenyl]-4,4'-diamine; or poly(9,9-dioctylfluorene-co-N-(4-butylphenyl)-diphenylamine.

In another embodiment, the hole injection material comprises a conjugated polymer and/or at least one arylamine polymer and/or at least one polythiophene and/or at least one regioregular polythiophene and/or at least one 3-substituted alkoxypolythiophene or a 3,4-substituted dialkoxypolythiophene.

In one embodiment, the SOM 1 and the SOM 2 are at least one first hole transporting material (HTM 1) and at least one second hole transporting material (HTM 2), different from the first hole transport material, respectively. In one embodiment, the HTM 2 has higher triplet energy than the HTM 1. In one embodiment, the HTM 2 has a triplet energy greater than 2.7 eV and the HTM 1 has a triplet energy less than or equal to 2.7 eV. In one embodiment, the HTM 1 is an arylamine. In one embodiment, the HTM 2 is an arylamine. In one embodiment, the HTM 2 is functionalized with at least one perfluoro or at least one semi-fluoro alkyl chain or aryl group. In one embodiment, the HTM 2 comprises at least one compound from the group consisting of:

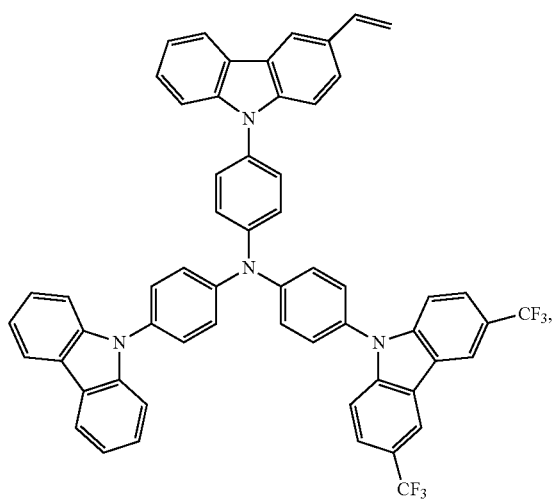

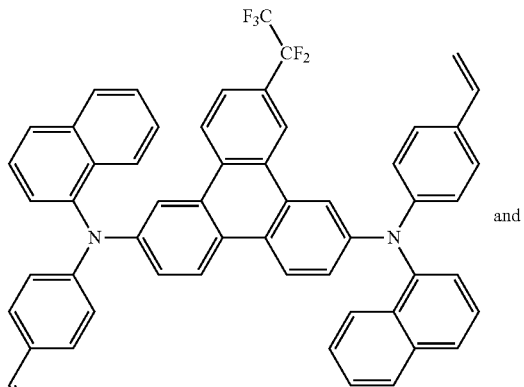

and

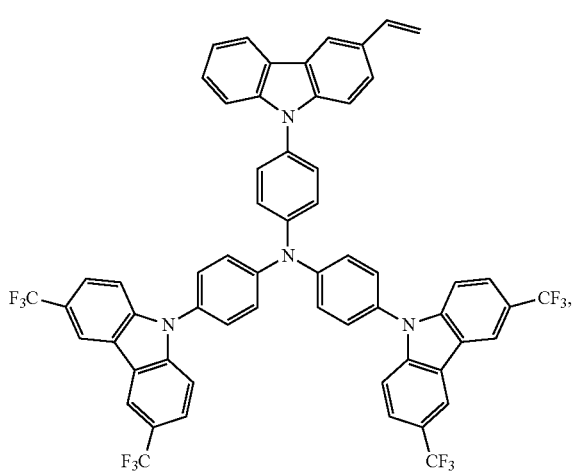

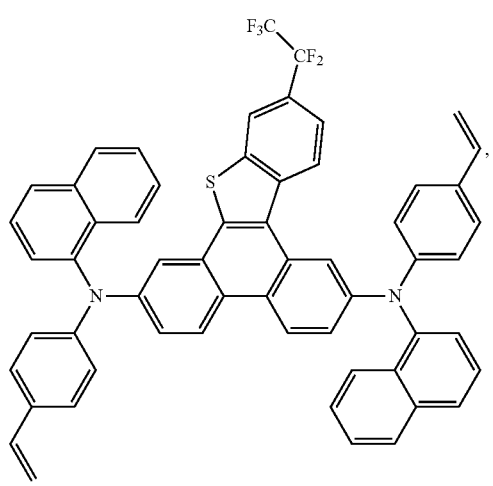

In one embodiment, the SOM 1 and the SOM 2 are at least one emissive material (EM) and at least one electron transporting material (ETM) respectively. In one embodiment, the ETM is functionalized with at least one perfluoro or at least one semi-fluoro alkyl chain or aryl group. In one embodiment, the ETM is an optionally substituted phenanthroline.

In one embodiment, the ETM comprises at least one compound from the group consisting of:

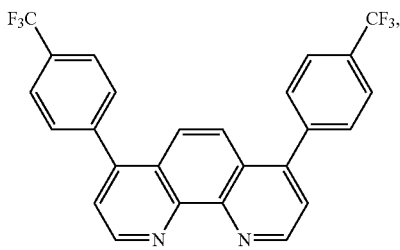

-continued
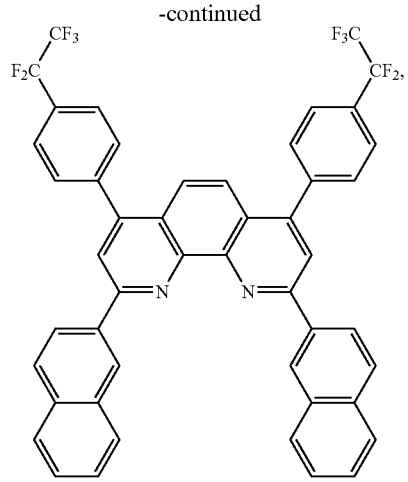
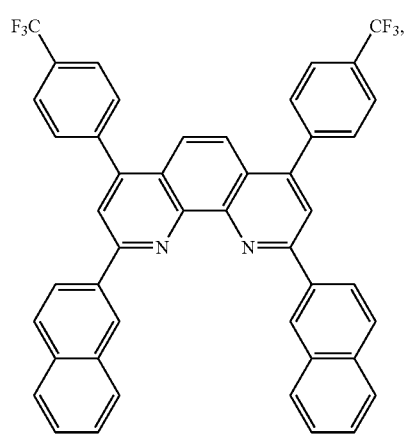
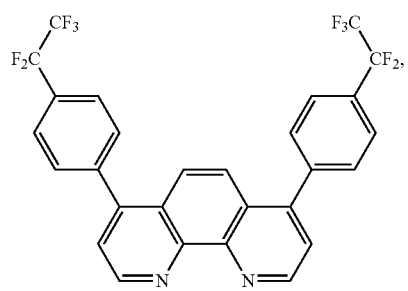
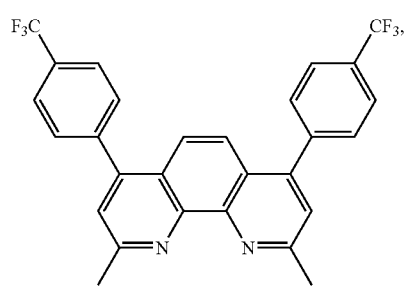
-continued
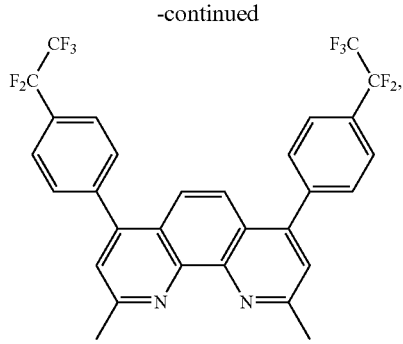
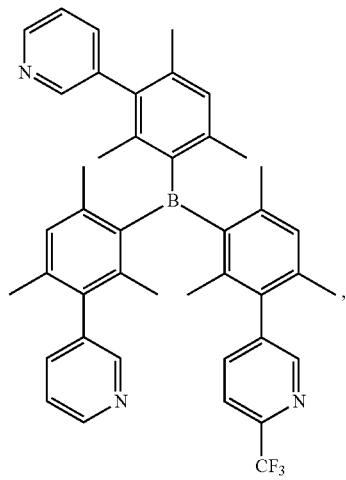
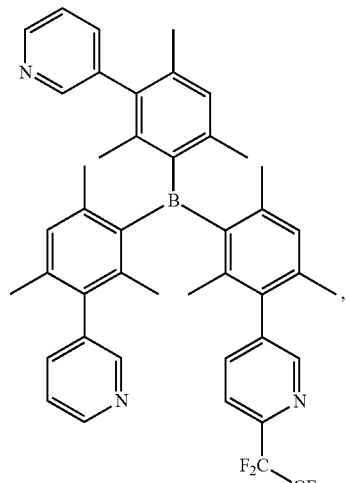

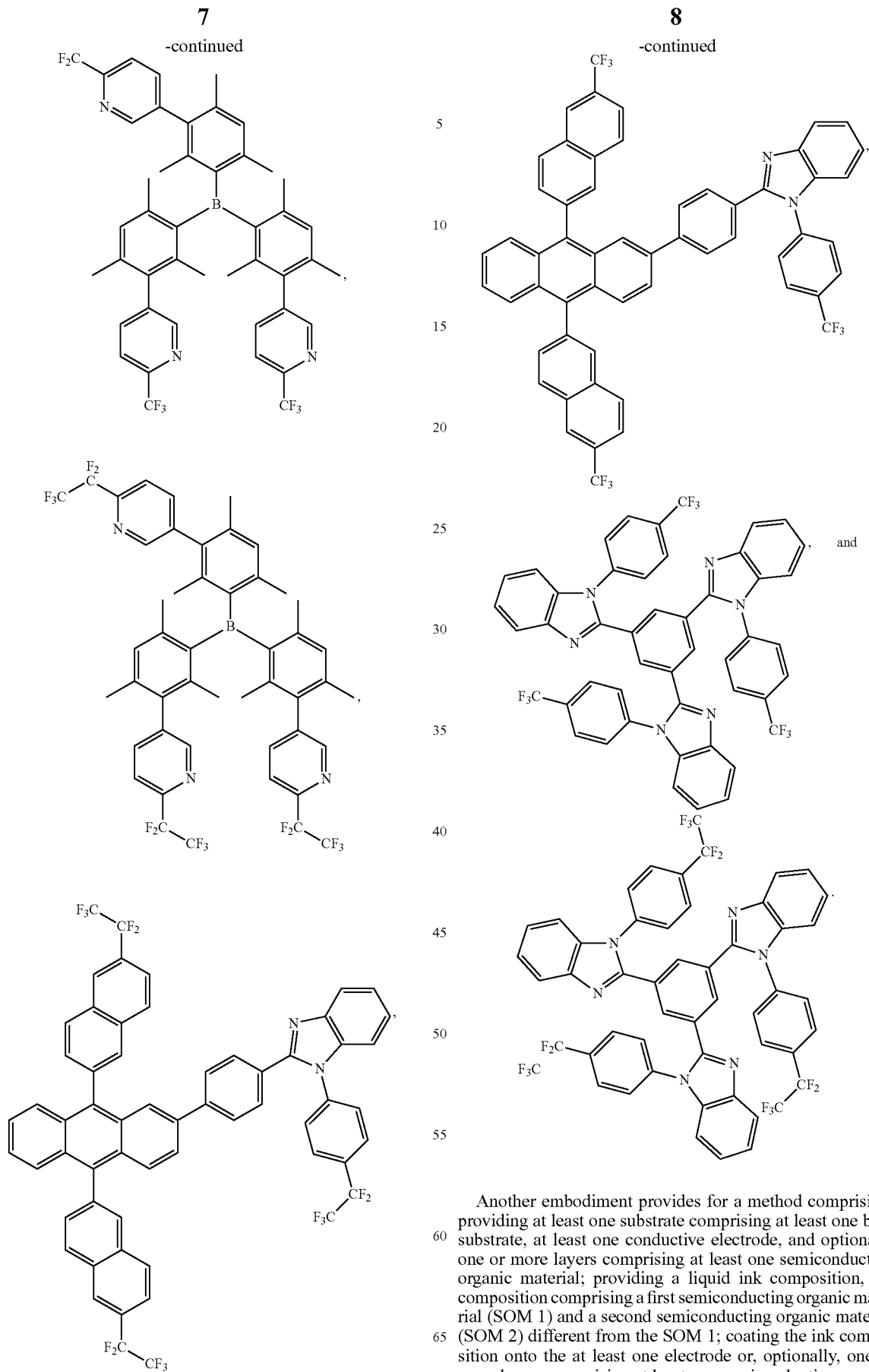

Another embodiment provides for a method comprising: providing at least one substrate comprising at least one base substrate, at least one conductive electrode, and optionally one or more layers comprising at least one semiconducting organic material; providing a liquid ink composition, the composition comprising a first semiconducting organic material (SOM 1) and a second semiconducting organic material (SOM 2) different from the SOM 1; coating the ink composition onto the at least one electrode or, optionally, one or more layers comprising at least one semiconducting organic material; drying the ink composition to form at least one film on the electrode or the layer comprising at least one semiconducting organic material, wherein the ink is adapted so that when it dries the film comprises at least one lower first layer disposed on the electrode or layer comprising at least one semiconducting organic material, and at least one upper second layer different from the first layer and disposed away from the electrode or layer comprising at least one semiconducting organic material, wherein the first layer is enriched with the SOM 1, and the second layer is enriched with the SOM 2, wherein the SOM 1 and the SOM 2 are selected from the group consisting of (a) at least one hole injection material (HIM) and at least one hole transporting material (HTM) which is different from the hole injection material, (b) at least one first hole transporting material (HTM 1) and at least one second hole transporting material (HTM 2) which is different than the first hole transporting material, or (c) at least one emissive material (EM) and at least one electron transporting material (ETM), respectively. In one embodiment, the SOM 2 comprises a structure represented by SOM 2-SAG, wherein SAG is a surface-active group and/or a structure represented by SOM 2-SAG, wherein SAG is a surface-active group comprising at least one fluoro substituent and/or represented by SOM 2-SAG, wherein SAG is a surface-active group comprising at least one alkyl substituent and/or represented by SOM 2-SAG, wherein SAG is a surface-active group comprising at least one siloxyl substituent. In one embodiment, the SOM 2 comprises at least one fluorinated alkyl group. In one embodiment, the SOM 2 comprises at least two fluorinated alkyl groups. In one embodiment, the SOM 2 comprises at least one trifluoromethyl group. In one embodiment, the SOM 2 comprises at least one hydrogen-bonding group and/or at least one hydroxyl group and/or at least one ionic or acidic group and/or the SOM 2 has a molecular weight of less than about 2,000 g/mol and/or the SOM 2 has a molecular weight of less than about 1,000 g/mol. In one embodiment, the second layer comprises greater than 50% of the SOM 2. In one embodiment, the first layer comprises greater than 50% of the SOM 1.

Another embodiment provides for a method of making a liquid ink composition, comprising: providing at least one solvent; providing a first semiconducting organic material (SOM 1) to the solvent; optionally providing to the solvent at least one matrix material different than the SOM 1; optionally providing to the solvent at least one dopant for the SOM 1, wherein the dopant does not substantially dope the optional matrix material, and the dopant comprises an ionic compound; and providing to the solvent a second semiconducting organic material (SOM 2) different from the SOM 1 and the matrix material, wherein the SOM 2 has a structure represented by SOM 2-SAG, wherein SAG is a surface active group or a polar group, wherein the SOM 1 and the SOM 2 are selected from the group consisting of (a) at least one hole injection material (HIM) and at least one hole transporting material (HTM), (b) at least one first hole transporting material (HTM 1) and at least one second hole transporting material (HTM 2), or (c) at least one emissive material (EM) and at least one electron transporting material (ETM), respectively.

Another embodiment provides for a device prepared with use of the composition of any embodiment herein, or a composition that is made by a method embodied herein.

Another embodiment provides for a device comprising: at least one substrate; at least one conductive electrode disposed on the substrate; optionally, one or more semi-conductive layers disposed on the conductive electrode; an organic semiconductive layer having an upper and a lower boundary disposed on the conductive electrode or optional semi-conductive layer, comprising at least one first semiconducting organic material (SOM 1) and at least one second semiconducting organic material (SOM 2) different from the SOM 1, wherein the SOM 2 is present in a higher weight percent at the upper boundary than at the lower boundary.

Another embodiment provides for a method comprising: providing at least one substrate; providing a liquid ink composition, the composition comprising at least one first semiconducting organic material (SOM 1) and at least one second semiconducting organic material (SOM 2) different from the SOM 1; coating the ink composition onto the substrate; drying the ink composition to form at least one film on the substrate, wherein the ink is adapted so that when it dries the film comprises at least one lower first layer disposed on the substrate, and at least one upper second layer different from the first layer and disposed away from the substrate, wherein the first layer is enriched with the at least one SOM 1, and the second layer is enriched with the at least one SOM 2, and wherein the SOM 1 and the SOM 2 are selected from the group consisting of (a) at least one hole injection material (HIM) and at least one hole transporting material (HTM) which is different than the hole injection material, (b) at least one first hole transporting material (HTM 1) and at least one second hole transporting material (HTM 2) which is different than the first hole transport material, or (c) at least one emissive material (EM) and at least one electron transporting material (ETM), respectively. In one embodiment, the SOM 1 and the SOM 2 are at least one hole injection material (HIM) and at least one hole transporting material (HTM) respectively. In one embodiment, the SOM 1 and the SOM 2 are at least one first hole transporting material (HTM 1) and at least one second hole transporting material (HTM 2) respectively. In one embodiment, the SOM 1 and the SOM 2 are at least one emissive material (EM) and at least one electron transporting material (ETM) respectively.

At least one advantage from at least one embodiment described herein includes improvement in operational stability including, for example, long term stability and overall increased lifetime of an organic electronic device such as for example an OLED, PHOLED, or OPV device. In particular, improvements can be realized compared to use of PEDOT/PSS controls. In particular, properties such as current density and luminescence can be improved.

At least one additional advantage for at least one embodiment includes more flexibility in the formulation and building of an organic electronic device, such as for example an LED, OLED, PHOLED, OPV, electrochromic device, supercapacitor, actuator, thin film transistor, or battery. In particular, the compositions described herein can be used when it is desirable to cast subsequent layers of emissive layers.

At least one additional advantage for at least one embodiment includes the elimination of unit operations, for example, coating and drying of a hole transport layer formed on a hole injection layer.

At least one additional advantage for at least one embodiment includes the reduction in the number of interfaces between layers in an electronic device, thereby enabling better hole transport, injection and lifetime.

At least one additional advantage for at least one embodiment includes graded interfaces and/or lower costs of manufacture.

At least one additional advantage for at least one embodiment includes eliminating the need of solvent orthogonality on at least two organic layers.

BRIEF DESCRIPTION OF THE FIGURES

FIGS. 1A-1D illustrate embodiments for OLED devices fabricated in a (A) conventional two layer coating method with two coating steps for HIL and HTL, (B) in a vertically phase separated HIL and HTL arrangement with a single coating step, (C) in a vertically phase separated HTL 1 and HTL 2 arrangement with a single coating step, and (D) in a vertically phase separated EML and ETL arrangement with a single coating step.

DETAILED DESCRIPTION

Introduction

All references cited herein are incorporated by reference in their entireties.

Priority U.S. provisional application 61/504,653 filed Jul. 5, 2011 is hereby incorporated by reference in its entirety.

US Patent Publication 2009/0256117, filed Apr. 10, 2009 (assignee: Plextronics, Inc.) describes a series of polymers, doping systems, and devices, and is hereby incorporated by reference including its working examples, figures, conjugated polymers, dopants, and claims.

US Patent Publication 2008/0248313 (filed Jul. 13, 2007) described sulfonated materials used in hole injection layer and hole transport layers and associated devices.

U.S. Pat. No. 7,569,159 describes hole injection layer and hole transport layers and associated devices.

US Patent Publications 2006/0078761 and 2006/0076050 (filed Sep. 26, 2005) describe conjugated polymers used in electroluminescent and photovoltaic devices.

The following US Patent Publication Nos. also describe hole injection materials and compositions, including planarizing agents, dopants, and solvent systems: 2009/0230361 (planarizing agents); 2010/0072462 (planarizing agents); 2010/0108954 (polyarylamine ketones); 2010/0109000 (charge injection); 2010/0292399 (aminobenzene); and 2011/0147725 (fused ring systems).

Conjugated polymers used in organic electronic devices are also described in, for example, WO 2009/152,165 (published Dec. 17, 2009); WO 2009/111,675 (published Sep. 11, 2009); WO 2009/111,339 (published Sep. 11, 2009).

OLED displays and materials are described in, for example, *Organic Light-Emitting Materials and Devices*, Li and Meng (Eds.), 2006. For example, this reference describes hole injection materials and hole transport materials (see Chapter 3, for example).

Other examples of organic materials and/or dopants include: EP 1725079; US 2007/0207341; WO 2009/102027; WO 2009/158069; U.S. Pat. No. 5,853,906; U.S. Pat. No. 5,999,780; and Nielsen et al., *J Am. Chem. Soc.*, 2008, 130, 9734-9746.

The following US Patents, Publication Nos. and publications describe emissive materials and compositions and are hereby incorporated by reference in their entirety, Youtian et al., *Chemical Society Reviews*, 2011), 40(5), 2943-2970; Ulbricht et al., *Advanced Materials*, 2009, 21(44), 4418-4441. Duan et al. *Journal of Materials Chemistry*, 2010, 20(31), 6392-6407; Highly Efficient OLEDs with Phosphorescent Materials, 2008, Edited by Yersin, Hartmut; Zhou et al. *Journal of Photochemistry and Photobiology, C: Photochemistry Reviews*, 2010, 11(4), 133-156. Kido et al., *Chemistry of Materials*, 2011, 23(3), 621-630. US2011/02409874 A1.

The following US Patents, Publication Nos. and publications hole transport materials and compositions with high triplet energies and are hereby incorporated by reference in their entirety, Shirota, et al., *Chem. Rev.*, 2007, 107, 953-1010, Yeob et al., *Organic Electronics*, 2012, 13, 1245; Yeob et al., *Organic Electronicsm*, 2012, 13, 1044; Yeob et al., *J. Mat. Chem.*, 2012, 22, 3099; Yeob et al., *Adv. Mat.*, 2011; Yeob et al., *Chemistry of Materials* (2011), 23(19), 4338-4343; Vygintas, *Molecular Crystals and Liquid Crystals*, 2011, 536, 200-207; Gu, *Applied Physics Letters*, 2008, 93(6), 063306/1-063306/3; WO2011049953, WO2011049904; Kondakova et al. *Journal of Applied Phys.*, 104, 2010, 094501/1. US2011/02409874 A1.

The following US Patents, Publication Nos. and publications describe electron transporting materials and compositions and are hereby incorporated by reference in their entirety, Shirota, et al., *Chem. Rev.*, 2007, 107, 953-1010; Jenekhe et al. *Advanced Functional Materials*, 3889-3899, Oct. 21, 2011; *Organic Electronics: Materials, Processing, Devices and Applications*, 2009, Ed. Franky So; US2011/02409874 A1.

Device Structures

Varieties of OLED device structures are known in the art and can be used. These include, for example, inverted, bottom emission, top emission, transparent, and stacked.

Substrate and Coated Substrates

A variety of substrates can be used as known in the art to support the different device structures.

Coated substrates of various kinds can be prepared. In some embodiments, the methods comprises providing at least one substrate comprising at least one base substrate, at least one transparent (or other) conductive electrode, and optionally one or more layers comprising at least one semiconducting organic material; providing a liquid ink composition, the composition comprising a first semiconducting organic material (SOM 1) and a second semiconducting organic material (SOM 2) different from the SOM 1; coating the ink composition onto the at least one electrode or, optionally, one or more layers comprising at least one semiconducting organic material; drying the ink composition to form at least one film on the electrode or the layer comprising at least one semiconducting organic material, wherein the ink is adapted so that when it dries the film comprises at least one lower first layer disposed on the electrode or layer comprising at least one semiconducting organic material, and at least one upper second layer different from the first layer and disposed away from the electrode or layer comprising at least one semiconducting organic material, wherein the first layer is enriched with the SOM 1, and the second layer is enriched with the SOM 2, wherein the SOM 1 and the SOM 2 are selected from the group consisting of (a) at least one hole injection material (HIM) and at least one hole transporting material (HTM), (b) at least one first hole transporting material (HTM 1) and at least one second hole transporting material (HTM 2), or (c) at least one emissive material (EM) and at least one electron transporting material (ETM), respectively. In one embodiment, for example, a method comprises: providing at least one substrate; providing a liquid ink composition, the composition comprising at least one hole injection material and at least one hole transporting material different than the hole injection material; coating the ink composition onto the substrate, drying the ink composition to form at least one film on the substrate, wherein the ink is adapted so that when it dries the film comprises at least one lower first layer disposed on the electrode, and at least one upper second layer different from the first layer and disposed away from the electrode, wherein the first layer is enriched with the at least one hole injection material, and the second layer is enriched with the at least one hole transporting material.

One additional embodiment provides at least one substrate comprising at least one base substrate and at least one electrode, including at least one transparent (or other) conductive electrode.

Substrates used for electronic devices are known in the art and can include flexible substrates and rigid substrates. Substrates can be adapted for roll-to-roll processing. Substrates can be self-supporting. A substrate can comprise a base substrate and an electrode thereon, including, for example, a transparent conductive electrode (TCO). The electrodes, including TCO, can be patterned.

Base Substrate

The base substrate can be, for example, a flexible substrate or a rigid substrate. For example, a base substrate can be a synthetic polymer or an inorganic material such as a glass or metal foil. For example, a base substrate can include glass, aluminum, stainless steel, PET, or PEN. Compositions described herein can be formed on the substrate or on a layer previously deposited on the substrate, such as at least one semiconducting organic material (e.g. hole transport layer or hole injection layer) or other material routinely used in an organic electronic device (e.g. matrix material or planarizing material).

Conductive Electrode

Electrodes can be formed on the base substrate. Electrodes used in organic electronic devices are known generally in the art, and include, for example, the following electrode types.

A transparent (or other) conductive electrode can be formed on the base substrate. For example, a transparent conductor such as ITO can be formed on a substrate such as metal foil, glass, aluminum, stainless steel, PET or PEN. Compositions described herein can be formed on the transparent (or other) conductive electrode. ITO replacement materials can be also used. ITO replacement materials are known in the art, and include, for example, those disclosed in "Indium Tin Oxide and Alternative Transport Conductors Markets, NanoMarkets, 2009. Additionally, metal grid-type electrodes may be used, and are known in the art, and include, for example, those disclosed in Appl. Phys. Lett. 96, 203301.

Liquid Ink

Liquid inks can be prepared with use of a solvent system. The solvent system can comprise one solvent or two or more solvents.

A method step can be to provide at least one liquid ink composition comprising at least one first semiconducting organic material (SOM 1); optionally providing at least one matrix material different than the SOM 1; optionally providing at least one dopant for the SOM 1, providing a second semiconducting organic material (SOM 2) different from the SOM 1 and the matrix material. In some embodiments, the dopant does not substantially dope the optional matrix material, and/or the dopant comprises an ionic compound. In some embodiments, the method does not include providing at least one matrix material different than the SOM 1. In another embodiment, the method includes providing at least one matrix material different than the SOM 1. In some embodiments, the method does not include providing at least one dopant for the SOM 1. In another embodiment, the method includes providing at least one dopant for the SOM 1. For example, a method step can be to provide at least one liquid ink composition comprising at least one hole injection material, such as a conjugated polymer, and at least one hole transporting material different than the hole injection material. In another embodiment, the SOM 1 and the SOM 2 are at least one hole injection material (HIM) and at least one hole transporting material (HTM) respectively. In another embodiment, the SOM 1 and the SOM 2 are at least one first hole transporting material (HTM 1) and at least one second hole transporting material (HTM 2) respectively. In another embodiment, the SOM 1 and the SOM 2 are at least one emissive material (EM) and at least one electron transporting material (ETM) respectively.

A liquid ink composition can comprise, for example, (i) at least one hole injection material, such as for example a conjugated polymer; (ii) optionally, at least one matrix material different than (i); (iii) at least one dopant for hole injection material, such as a conjugated polymer (i), wherein the dopant does not substantially dope optional matrix material (ii), and the dopant comprises an ionic compound; (iv) at least one hole transporting compound different from the conjugated polymer and the matrix material; and (v) at least one solvent.

The liquid ink composition can be coated onto the electrode, for example the conductive electrode, or on a layer previously deposited on the substrate, such as at least one semiconducting organic material (e.g. hole transport layer or hole injection layer) or other material routinely used in an organic electronic device (e.g. matrix material or planarizing material). The ink composition can be dried, for example by removing a portion or all of the solvent to form at least one film on the electrode, for example a film that has greater than 90% transmission at a thickness of about 90 nm for radiation between 380-800 nm wavelength. The ink composition can be formulated to vertically phase separate into at least two layers.

Hole Injection Material Including Conjugated Polymer

A wide range of examples of hole injection materials are known in the art, which can be small molecules or polymers, and can be neutral or doped. The polymers can be highly conjugated or can contain discrete hole transporting materials such as, for example, triarylamines, substituted benzidines, substituted carbazoles, and the like. Polymers can be functionalized in the main chain or the side chain. See, for example, the references cited in the Introduction Section including US Patent Pub. 2010/0108954 and 2010/0292399.

The composition can comprise, for example, at least one conjugated polymer. Conjugated polymers are known in the art including their use in organic electronic devices. See for example Friend, "Polymer LEDs," *Physics World*, November 1992, 5, 11, 42-46; see for example Kraft et al., "Electroluminescent Conjugated Polymers-Seeing Polymers in a New Light," *Angew. Chem. Int. Ed.*, 1998, 37, 402-428. In addition, electrically conductive or conjugated polymers are described in The Encyclopedia of Polymer Science and Engineering, *Wiley*, 1990, pages 298-300, including polyacetylene, poly(p-phenylene), poly(p-phenylene sulfide), polypyrrole, and polythiophene, including families of these polymers and derivatives in these polymer systems, which is hereby incorporated by reference in its entirety. This reference also describes blending and copolymerization of polymers, including block copolymer formation.

The conjugated polymer can be any conjugated polymer, including polythiophenes, and can be homopolymers, copolymers, or block copolymers. Synthetic methods, doping, and polymer characterization, including regioregular polythiophenes with side groups, is provided in, for example, U.S. Pat. No. 6,602,974 to McCullough et al. and U.S. Pat. No. 6,166,172 to McCullough et al., which are hereby incorporated by reference in their entirety. Additional description can be found in the article, "The Chemistry of Conducting Polythiophenes," by Richard D. McCullough, *Adv. Mater.*, 1998, 10, No. 2, pages 93-116, and references cited therein, which is hereby incorporated by reference in its entirety. Another reference, which one skilled in the art can use, is the *Handbook of Conducting Polymers, 2nd Ed.*, 1998, Chapter 9, by McCullough et al., "Regioregular, Head-to-Tail Coupled Poly(3-alkylthiophene) and its Derivatives," pages 225-258, which is hereby incorporated by reference in its entirety. This reference also describes, in chapter 29, "Electroluminescence in Conjugated Polymers" at pages 823-846, which is hereby incorporated by reference in its entirety.

Polythiophenes are further described, for example, in Roncali, J., Chem. Rev. 1992, 92, 711; Schopf et al., *Polythiophenes: Electrically Conductive Polymers*, Springer: Berlin, 1997. See also for example U.S. Pat. Nos. 4,737,557 and 4,909,959.

Polymeric semiconductors are described in, for example, "Organic Transistor Semiconductors" by Katz et al., *Accounts of Chemical Research*, vol. 34, no. 5, 2001, page 359 including pages 365-367, which is hereby incorporated by reference in its entirety.

Conjugated polymers can be, for example, copolymers including block copolymers. Block copolymers are described in, for example, *Block Copolymers, Overview and Critical Survey*, by Noshay and McGrath, Academic Press, 1977. For example, this text describes A-B diblock copolymers (chapter 5), A-B-A triblock copolymers (chapter 6), and -(AB)$_n$- multiblock copolymers (chapter 7), which can form the basis of block copolymer types in the present invention.

Additional block copolymers, including polythiophenes, are described in, for example, Francois et al., *Synth. Met.*, 1995, 69, 463-466, which is incorporated by reference in its entirety; Yang et al., *Macromolecules,* 1993, 26, 1188-1190; Widawski et al., *Nature (London)*, vol. 369, Jun. 2, 1994, 387-389; Jenekhe et al., *Science,* 279, Mar. 20, 1998, 1903-1907; Wang et al., *J. Am. Chem. Soc.,* 2000, 122, 6855-6861; Li et al., *Macromolecules,* 1999, 32, 3034-3044; Hempenius et al., *J. Am. Chem. Soc.,* 1998, 120, 2798-2804.

Substituents that can be used to solubilize conducting polymers with side chains include alkoxy and alkyl including for example C1 to C25 groups, as well as heteroatom systems, which include for example oxygen and nitrogen. In particular, substituents having at least three carbon atoms, or at least five carbon atoms can be used. Mixed substituents can be used. The substituents can be nonpolar, polar or functional organic substituents. The side group can be called a substituent R which can be for example alkyl, perhaloalkyl, vinyl, acetylenic, alkoxy, aryloxy, vinyloxy, thioalkyl, thioaryl, ketyl, thioketyl, and optionally can be substituted with atoms other than hydrogen.

Conjugated polymers can comprise heterocyclic monomer repeat units, and heterocyclic polymers are particularly preferred. A particularly preferred system is the polythiophene system, regioregular polythiophene system, the 3-substituted polythiophene system, and the 3,4-disubstituted polythiophene system. Polymers can be obtained from Plextronics, Inc., Pittsburgh, Pa. including for example polythiophene-based polymers such as for example PLEXCORE, Plexcoat, and similar materials.

The conjugated polymer can comprise at least one 3-substituted alkoxypolythiophene or a 3,4-substituted dialkoxypolythiophene.

One important example of a conjugated polymer, and formulations and devices using the polymer, is a 3-substituted polythiophene. Preferably, the 3-substituted polythiophene may be a poly(3-alkoxythiophene).

Another important example of a conjugated polymer, and formulations and devices using the polymer, is a regioregular polythiophene. Preferably, regioregularity of the polythiophene may be, for example, about 85%, or at least about 95%, or at least about 98%. In some embodiments, the degree of regioregularity can be at least about 70%, or at least about 80%. In yet other embodiments, the regioregular polythiophene has a degree of regioregularity of at least about 90%, or a degree of regioregularity of at least about 98%.

One important example of a conjugated polymer, and formulations and devices using the polymer, is a 3,4-disubstituted polythiophene. Preferably, the 3,4-disubstituted polythiophene may be a poly(3,4-dialkoxythiophene) or a poly(3,4-di-polyether)-thiophene. A polyether is a molecule with more than one ether group. The alkoxy and polyether side groups can donate electrons to the polymer backbone chain.

The 3,4-disubstituted polythiophene may have a symmetrical monomer repeating unit. Often times, the 3,4-disubstituted polythiophene comprises a 3,4-substituted thiophene as the repeating unit, with an oxygen atom directly attached to the 3- and 4-positions of the disubstituted thiophene and polymerized through the 2- and 5-positions. Substituents can be used to solubilize the 3,4-substituted thiophene with side chains that can include alkoxy and polyether, including for example, straight or branched carbon chains, for example, C1 to C25 groups, wherein one, two, three, four, five, or six of the carbon atoms in the chains may be replaced by heteroatoms, such as, oxygen and/or nitrogen.

The conjugated polymer may be prepared by polymerization of a monomer unit, such as 2,5-dibromo-3,4-bis(2-(2-butoxyethoxy)ethoxy)thiophene, or 2,5-dibromo-3,4-bis(2-(2-ethoxyethoxy)ethoxy)thiophene; 2,5-dibromo-3,4-bis(2-(2-methoxyethoxy)ethoxy)thiophene; 2,5-dibromo-3,4-bis(2-(2-butoxyethoxy)ethoxy)thiophene; 2,5-dibromo-3,4-bis(2-(2-butoxybutoxy)butoxy)thiophene; and 2,5-dibromo-3,4-bis(2-(2-methoxymethoxy)methoxy)thiophene.

Any known methods of polymerization may be used to obtain the 3,4-disubstituted polythiophene. Typically, the polymer itself can be obtained by GRIM polymerization of the 2,5-dibromo derivative of the dialkoxythiophene or dipolyetherthiophene using a Nickel catalyst.

GRIM polymerization of a symmetrical monomer is described in, for example, Campos et al., *Photovoltaic Activity of a PolyProDOT Derivative in a Bulk Heterojunction Solar Cell*, Solar Energy Materials & Solar Cells, August 2006.

The conjugated polymer can be a 3,4-disubstituted polythiophene, such as poly(3,4-bis(2(2-butoxyethoxy)ethoxy) thiophene)-2,5-diyl, poly(3,4-bis(2-(2-ethoxyethoxy) ethoxy)thiophene)2,5-diyl; poly(3,4-bis(2-(2-methoxyethoxy)ethoxy)thiophene)-2,5-diyl; poly(3,4-bis(2-(2-butoxyethoxy)ethoxy)thiophene)-2,5-diyl; poly(3,4-bis(2-(2-butoxybutoxy)butoxy)thiophene)2,5-diyl; and poly(3,4-bis(2-(2-methoxymethoxy)methoxy)thiophene)-2,5-diyl.

Typically, the conjugated polymer can be a 3,4-disubstituted polythiophene represented

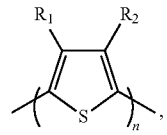

wherein independently $R_1$ can be an optionally substituted alkoxy group or an alkoxy heteroatom group, such as, for example, an alkoxyalkoxyalkoxy moiety, and independently $R_2$ can be an optionally substituted alkoxy group alkoxy heteroatom group, such as, for example, an alkoxyalkoxyalkoxy moiety; or wherein independently $R_1$ can be optionally substituted alkyl, and optionally substituted aryloxy, and independently $R_2$ can be optionally substituted alkyl, and optionally substituted aryloxy. Examples of substituents for the optional substitution include hydroxyl, phenyl, and additional optionally substituted alkoxy groups. The alkoxy groups can be in turn optionally substituted with hydroxyl, phenyl, or alkoxy groups; or wherein independently $R_1$ can be an optionally substituted alkylene oxide, and independently $R_2$ can be an optionally substituted alkylene oxide. Substituents can be for example hydroxyl, phenyl, or alkoxy groups; or wherein independently $R_1$ can be optionally substituted ethylene oxide or optionally substituted propylene oxide or other lower alkyleneoxy units, and independently $R_2$ can be optionally substituted ethylene oxide or optionally substituted propylene oxide or other lower alkyleneoxy units. Substituents can be for example hydroxyl, phenyl, or alkoxy groups; or wherein independently $R_1$ can be an optionally substituted alkylene such as for example methylene or ethylene, with substituents being for example optionally substituted alkyleneoxy such as ethyleneoxy or propyleneoxy; substituents can be for example hydroxyl, phenyl, or alkoxy, and independently $R_2$ can be an optionally substituted alkylene such as for example methylene or ethylene, with substituents being for example optionally substituted alkyleneoxy such as ethyleneoxy or propyleneoxy; substituents can be for example hydroxyl, phenyl, or alkoxy.

In addition, the substituent groups $R_1$ and $R_2$ can be linked to the thiophene by an oxygen atom such as alkoxy or phenoxy, wherein the substituent can be characterized by the corresponding alcohol or phenol, respectively. The alcohol, for example, can be linear or branched, and can have C2-C20, or C4-C18, or C6 to C14 carbon atoms. The alcohol can be for example an alkyl alcohol, or an ethylene glycol, or a propylene glycol, or a diethylene glycol, or a dipropylene glycol, or a tripropylene glycol. Additional examples can be monoethylene glycol ethers and acetates, diethylene glycol ethers and acetates, triethylene glycol ethers and acetates, and the like. Examples of alcohols which can be linked to the thiophene ring through the oxygen atom include hexyl cellosolve, Dowanol PnB, ethyl carbitol, Dowanol DPnB, phenyl carbitol, butyl cellosolve, butyl carbitol, Dowanol DPM, diisobutyl carbinol, 2-ethylhexyl alcohol, methyl isobutyl carbinol, Dowanol Eph, Dowanol PnP, Dowanol PPh, propyl carbitol, hexyl carbitol, 2-ethylhexyl carbitol, Dowanol DPnP, Dowanol TPM, methyl carbitol, Dowanol TPnB. The trade names are well known in this art. Polythiophene substituents, including various alkoxy and polyether substituents, and formulations are described in for example U.S. patent application Ser. No. 11/826,394 filed Jul. 13, 2007 (US publication 2008/0248313).

The degree of polymerization n is not particularly limited but can be for example 2 to 500,000 or 5 to 100,000 or 10 to 10,000, or 10 to 1,000, 10 to 500, or 10 to 100. In many cases, and polymer has a number average molecular weight between approximately 5,000 and 100,000 g/mol. In some embodiments, R can be a monoalkoxy, dialkoxy, trialkoxy, or tetraalkoxy group and the conjugated polymer is a poly(3,4-dialkoxythiophene) or poly(3,4-dipolyetherthiophene).

An example of side groups is the butoxyethoxy(ethoxy) group and the polymer can be poly-3,4-bis(2-(2-butoxyethoxy)ethoxy)thiophene-2,5-diyl.

Dopant

The hole injection material, including for example conjugated polymer, can be mixed with the dopant. A reaction can occur upon mixing. In particular, the conjugated polymer can be doped with a dopant. A dopant can be, for example, a material that will undergo one or more electron transfer reaction(s) with, for example, a conjugated polymer, thereby yielding a doped conjugated polymer. The dopant can be selected to provide a suitable charge balancing counter-anion. For example, the dopant may undergo spontaneous electron transfer from the polymer to a cation-anion dopant such as a metal salt, leaving behind a conjugated polymer in its oxidized form with an associated anion and free metal. As discussed herein, the conjugated polymer and the dopant, or dopant, can refer to components that will react to form a doped polymer. The doping reaction can be a charge transfer reaction, wherein charge carriers are generated, and the reaction can be reversible or irreversible. Dopants are known in the art. See, for example, US Patent No. or Publication No. U.S. Pat. No. 7,070,867; 2005/0123793; 2004/0113127.

The anion TPFB is known in the art. See, for example, Hijazi et al., *European J. Inorganic Chemistry*, 2008, 18, 2892-2898; Ogawa et al., *Organometallics*, 2005, 24(20), 48424844; Kuprat et al., *Organometallics*, 2010, 29(6), 1421-1427 (suggesting AgTPFB is less stable than LiTPFB). TPFB can complex with a variety of cations, including monovalent and divalent cations, and can also be coordinated or complexed with polar and nonpolar ligands such as acetonitrile, methylene chloride, diethyl ether, pentane, benzene, or toluene.

Hole Transporting Material or Compound

The ink composition can include a hole transporting material or a hole transporting compound. In some embodiments, the ink composition can comprise at least one first hole transporting material or a hole transporting compound (HTM 1) and at least one second hole transporting material or a hole transporting compound (HTM 2). The hole transporting compound can be a polymer. The hole transporting compound can be a small molecule. The hole transporting compound can have a molecular weight of less than 5,000 g/mol, or less than 2,000 g/mol, for example. The hole transporting compound can comprise a fluorinated, or partially fluorinated hole transporting compound. The hole transporting compound can be undoped. The hole transporting compound can be hydrogen bonded. The hole transporting compound can be crosslinked. The hole transport compound can be self-surfacing. The hole transport compound can comprise optionally substituted alkyl or aryl groups as well as heteroalkyl and heteroaryl groups.

In some embodiments, the hole transporting compound can comprise a metal organic framework including crosslinking.

The hole transporting compound can comprise, for example, N4,N4'-bis(4-tidecafluorononyloxy-phenyl)-N4,N4'-diphenyl-[1,1'-biphenyl]-4,4'-diamine.

The hole transporting compound can comprise, for example, N4,N4'-bis(4-vinylphenyl)-N4,N4'-diphenyl-[1,1'-biphenyl]-4,4'-diamine.

The hole transporting compound can comprise, for example, poly(9,9-dioctyl-fluoreneco-N-(4-butylphenyl)-diphenylamine.

The hole transporting compound can comprise, $N_7$-di(naphthalen-1-yl)-$N_2$,$N_7$-diphenyl-9H-fluorene-2,7-diamine (DMFL-NPD).

Suitable hole transporting compounds can have a HOMO $\geq -5.1$ eV, for example, deeper than −5.1 eV, for example about −5.3 eV as measured by Photoelectronic spectroscopy in air (PESA).

Other hole transporting materials are described in, for example, U.S. Ser. No. 13/175,710 (US Patent Publication 2012/0001127) and Ser. No. 13/175,714 (assignee: Plextronics), each filed Jul. 1, 2011. In addition, hole transporting materials are described in, for example, U.S. Ser. No. 61/647, 428 Filed May 15, 2012. Each of these references is incorporated by reference in their entirety. The hole transporting material can be a cross-linkable compound.

Suitable hole transporting compounds can include, for example, those represented by the structure HTM-SMG, wherein HTM is a hole transporting group and SMG is a surface active group. Suitable hole transporting compounds can include those represented by at least one of the following structures:

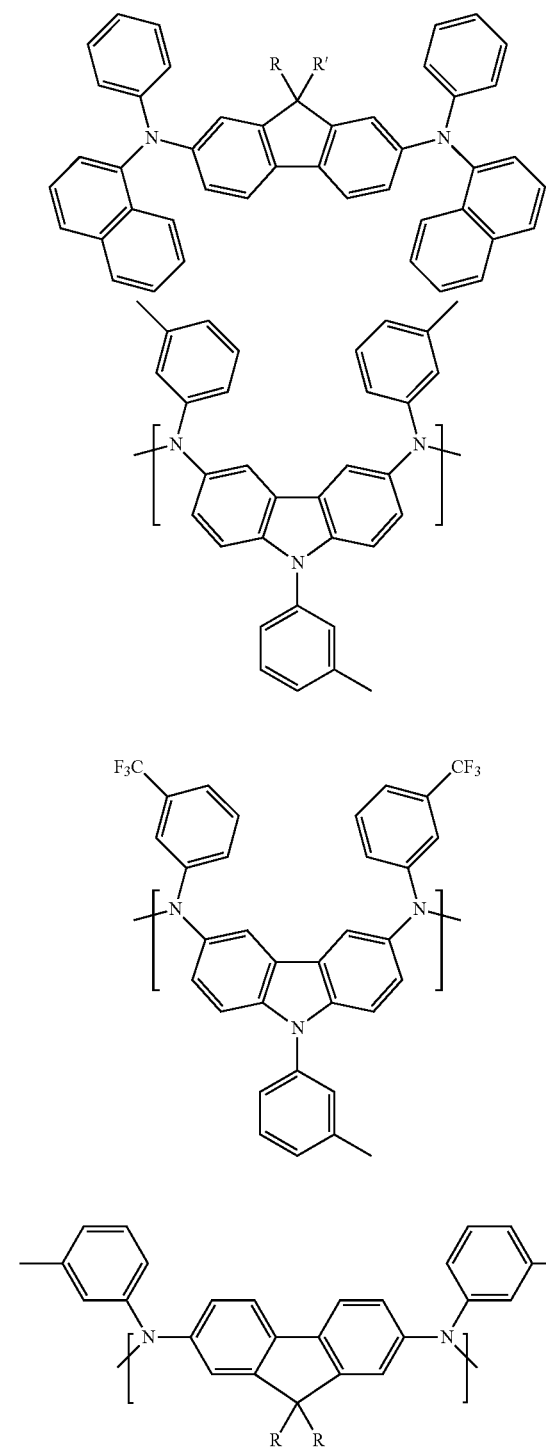
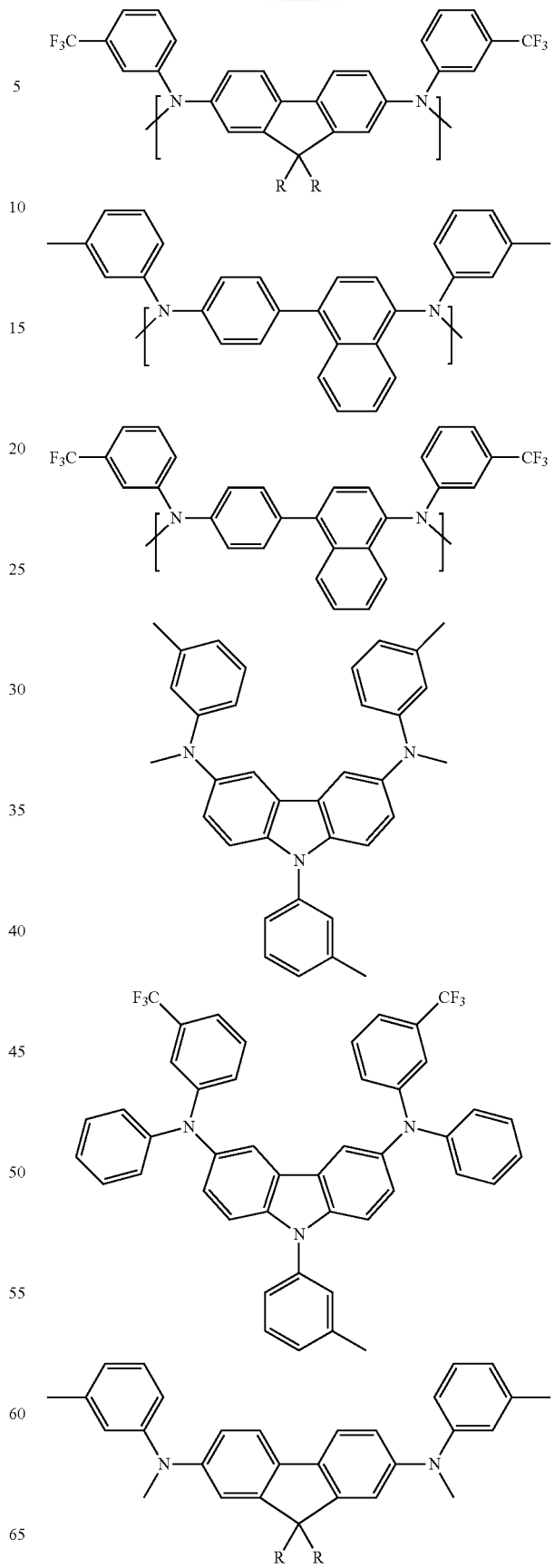

-continued

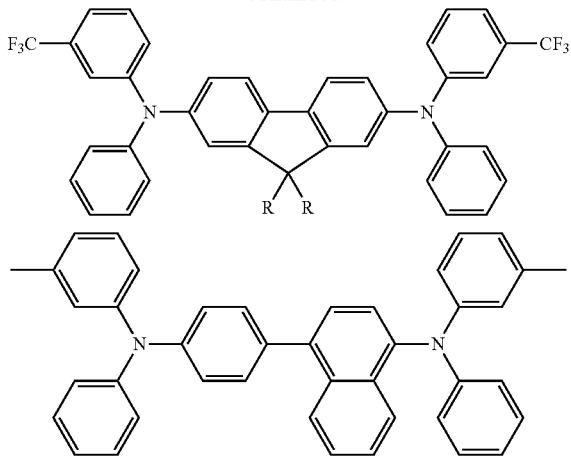

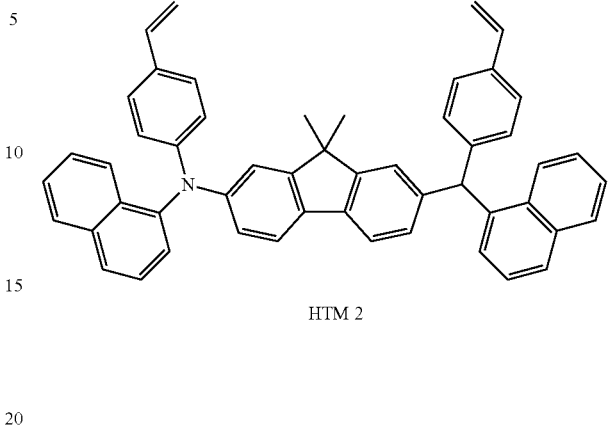

HTM 2 wherein the R groups are selected from, for example, alkyl chains, perfluoro or semifluoro alkyl chains or siloxanes, and may include functional groups selected from the list shown in Table 1.

TABLE 1

List of functionalities and starting synthons to achieving the same

| R-X | Final product | Additional steps |
|---|---|---|
| \multicolumn{3}{c}{Surface energy approach} | | |
| n-$C_8H_{17}$Br | (n-$C_8F_{17}$)$_2$(DMFL-NPD) | None |
| $C_6F_{13}(CH_2)_3$I | ($C_6F_{13}(CH_2)_3$)$_2$(DMFL-NPD) | None |
| PhOCH$_2$(Si(CH$_3$)$_2$O)$_4$Cl | (PhOCH$_2$(Si(CH$_3$)$_2$O)$_4$)$_2$(DMFL-NPD) | None |
| \multicolumn{3}{c}{Solubility approach} | | |
| ω-Propanesulfone | n-Bu$_4$N$^+$−SO$_3$(CH$_2$)$_3$(DMFL-NPD) | Metathesis with tetrabutyl ammonium bromide |
| (CH$_3$)$_3$N$^+$(Br$^-$)C$_5$H$_{10}$Br | (CH$_3$)$_3$N$^+$(PF$_6^-$)C$_5$H$_{10}$(DMFL-NPD) | Metathesis with potassium hexafluorophosphate |
| n-$C_8H_{17}$Br | (n-$C_8H_{17}$)$_2$(DMFL-NPD) | None |

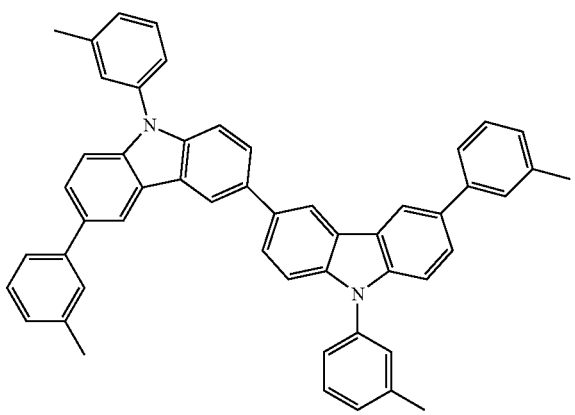

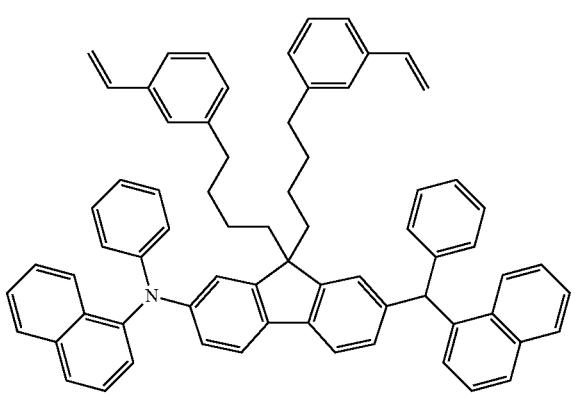

HTM 1

Other suitable hole transporting compounds can include fluorinated hole transport compounds, such as those represented by the structures that follow.

23    24
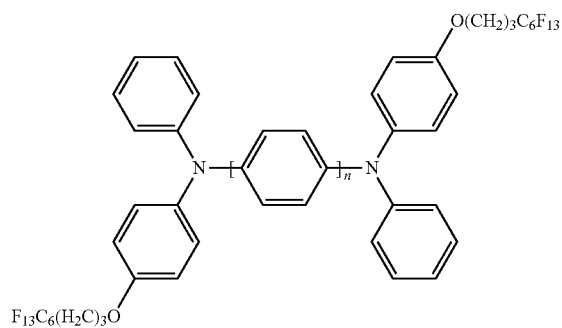
n = 1-4
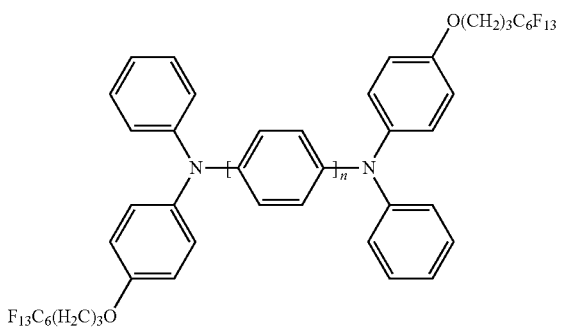
n = 1-4
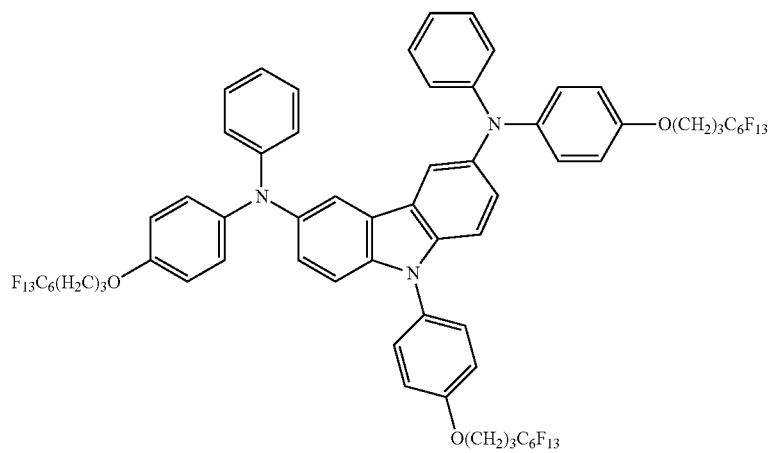
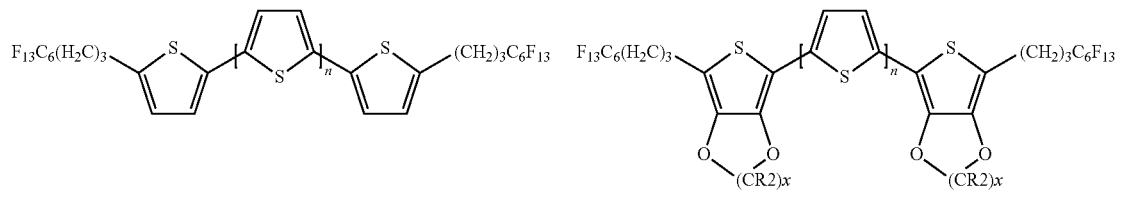
n = 0-2
x = 1-4
R = H or alkyl
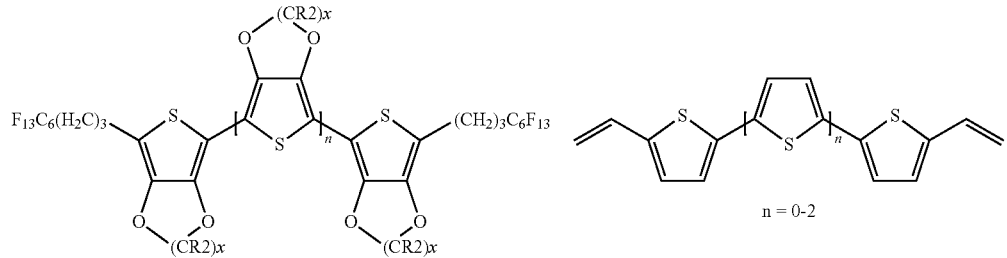
n = 0-2
x = 1-4
R = H or alkyl
n = 0-2
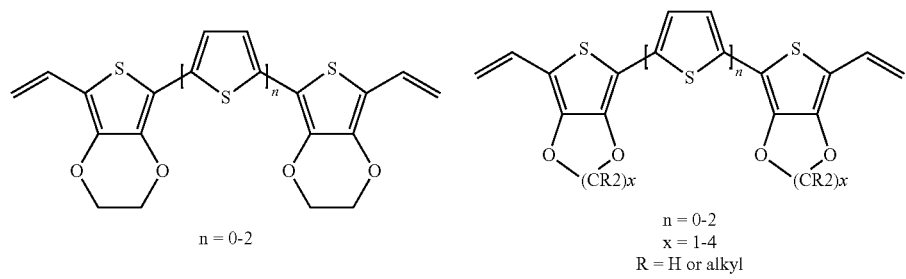
n = 0-2
n = 0-2
x = 1-4
R = H or alkyl

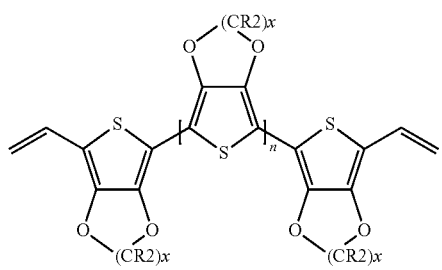

n = 0-2
x = 1-4
R = H or alkyl

In some embodiments, the ink composition comprises at least one first hole transporting material or a hole transporting compound (HTM 1) and at least one second hole transporting material or a hole transporting compound (HTM 2). In an embodiment, the HTM 2 has higher triplet energy than the HTM 1. For example, in one embodiment, the HTM 2 has a triplet energy greater than 2.7 eV and the HTM 1 has a triplet energy less than or equal to 2.7 eV as measured from phosphorescence spectrum, Mikhnenko, et al., Phys. Rev. Lett. 108, 2012, 137401; Baldo et al. Phys. Rev. B 62, 2000, 10958-10966; Leo et al *Physical Review B,* 2010, Volume: 81, Issue: 24, Murov et al. *Handbook of Photochemistry. 3rd edition,* Turro N. J., *Modern Molecular Photochemistry,* 1991.

The HTM 1 can be an arylamine and/or a functionalized with at least one perfluoro or at least one semi-fluoro alkyl chain or aryl group. Examples show fluorinated methyl and ethyl but preferred embodiments are not limited to specific structures. Iterative design of solubility properties utilizing the well-known Hanson solubility parameters would be employed in addition to iterative synthesis to identify an ideal structure for this application. In one embodiment, the HTM 1 is one or more of any of the preceding hole transport materials recited herein. In another embodiment, The HTM 2 can be a hole transport material different than HTM 1. In some embodiments, HTM 2 has triplet energy greater than 2.7 eV. The higher triple energy of HTM 2 may be used, for example, in green or blue emissive PHOLEDs. In one embodiment, the HTM 2 is an arylamine and/or fluorinated hole transport compounds, such as those represented by the structures that follow. Specific embodiments of HTM 2 include but are not limited to the following example compounds.

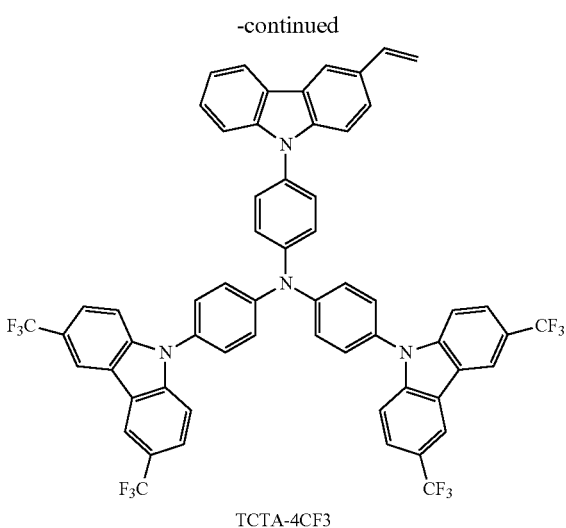

TCTA-4CF3

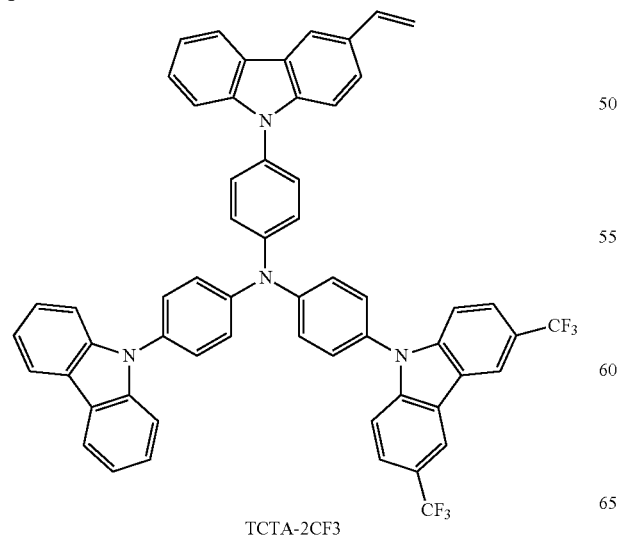

TCTA-2CF3

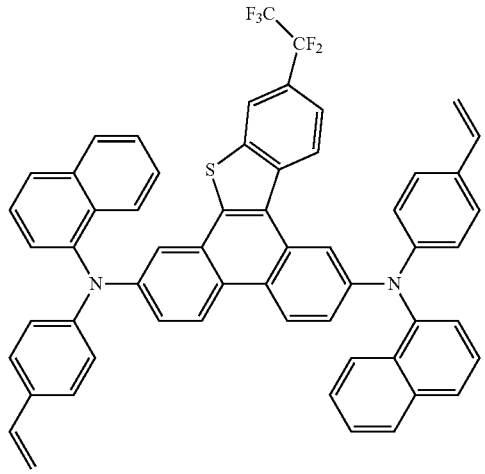

-continued

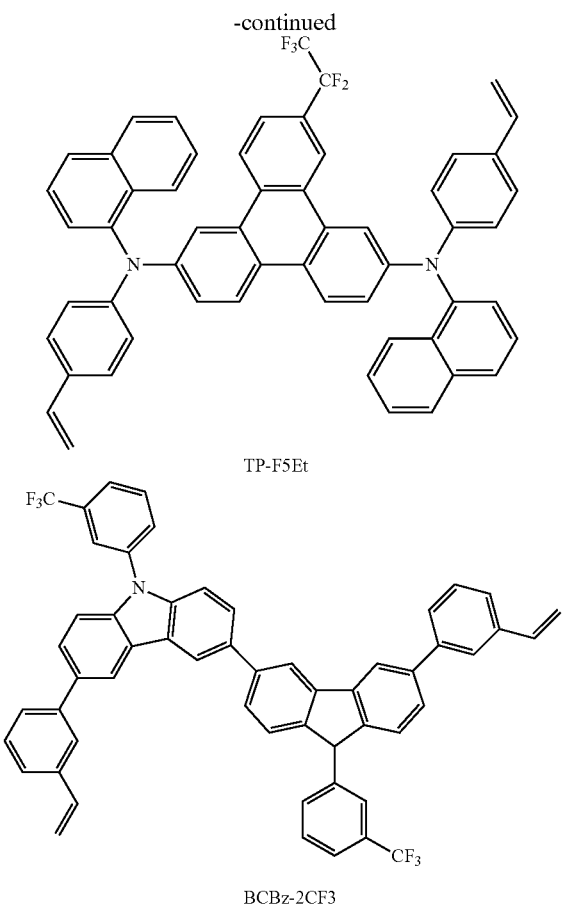

TP-F5Et

BCBz-2CF3

In one embodiment, the HTM 2 material may be represented by the following generic structure:

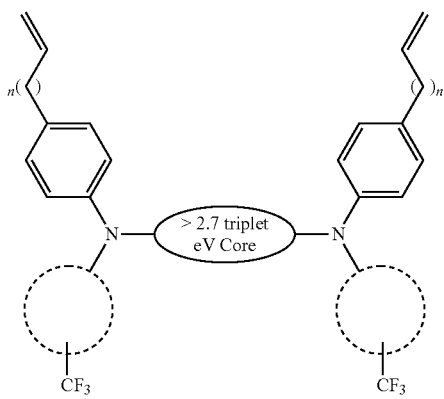

wherein n is any integer from 1 to 20, or any combination of integers therein. The dashed circles may be aryl or heteroaryl moieties, and may be the same or different. The alkylene moieties are shown as para bonded, but may be meta or ortho, and there may be one or more alkene moieties bound to each phenyl. The alkene moieties may be replaced by other moieties known as effective crosslinking or annealing moieties. In another embodiment, the phenyl may be replaced by another aryl or heteroaryl moiety. In another embodiment, the $CF_3$ may be substituted more than one time per dashed circle. In another embodiment, the $CF_3$ may be replaced by another alkylene comprising one or more fluoro substituents, such as C1-C10 perfluoroalkyl. One may adjust the surfacing ability of adding or removing fluoro moieties from the compound. In one embodiment, the >2.7 triplet eV core, may be a moiety known in the art to have a eV of this level, or it may be a arylamine or heteroaryl compound that causes the compound to have this eV value overall. One of skill in the art can easily test a compound to determine the eV value by known methods.

Emissive Material or Compound

The ink composition can include an emissive material or compound (EM). In some embodiments, the ink composition can comprise at least one EM and at least one electron transporting material or compound (ETM).

The EM can be a polymer. The EM can be a small molecule. The EM can have a molecular weight of less than 5,000 g/mol, or less than 2,000 g/mol, for example. The EM can comprise a fluorinated, or partially fluorinated EM. The EM can be undoped. The EM can be hydrogen bonded. The EM can be crosslinked. The EM can comprise optionally substituted alkyl or aryl groups as well as heteroalkyl and heteroaryl groups. The EM can comprise a fluorinated or partially fluorinated side chain.

Electron Transporting Material or Compound

The ink composition can include an emissive material or compound (EM). In some embodiments, the ink composition can comprise at least one EM and at least one electron transporting material or compound (ETM).

The ETM can be a polymer. The ETM can be a small molecule. The ETM can have a molecular weight of less than 5,000 g/mol, or less than 2,000 g/mol, for example. The ETM can comprise a fluorinated, or partially fluorinated hole transporting compound. The ETM can be undoped. The ETM can be hydrogen bonded. The ETM can be crosslinked. The ETM can be self-surfacing. The ETM can comprise optionally substituted alkyl or aryl groups as well as heteroalkyl and heteroaryl groups. The ETM can comprise fluorinated side chains.

One representative structure for some embodiments of the ETM is of the structure:

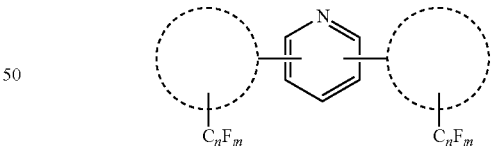

wherein n can be an integer 1-10 or any individual integer therein; m can be 2n+1, or, if there are one or more alkene or alkyne moieties in the carbon structure, then m is a number wherein the carbon $C_n$ are fully substituted by fluoro groups. The dashed circles may be aryl or heteroaryl moieties, and may be the same or different. The pyridine moiety can be replaced with different heteroaryl compounds, such as nitrogen containing heteroaryl compound.

In one embodiment, ETM is an optionally substituted phenanthroline. In one embodiment, the ETM comprises at least one compound represented by one of the following formulas.

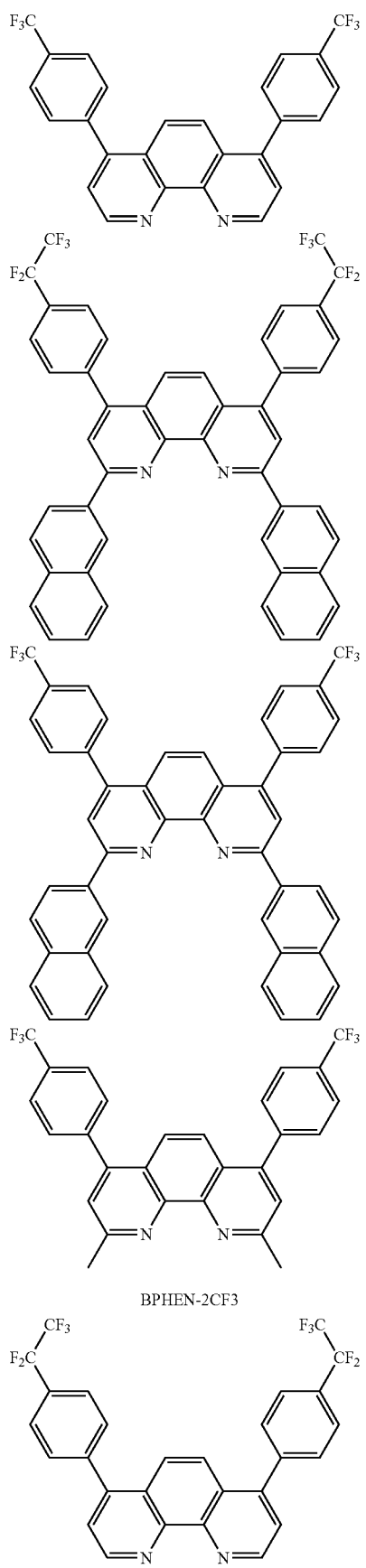
BPHEN-2CF3
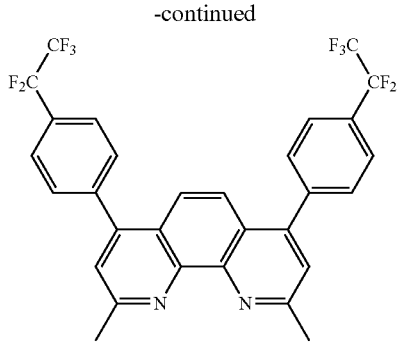
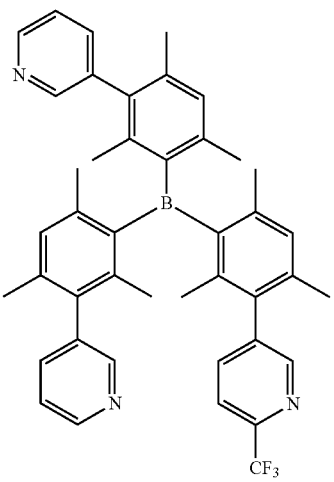
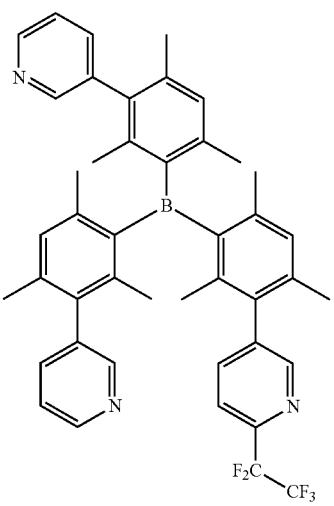

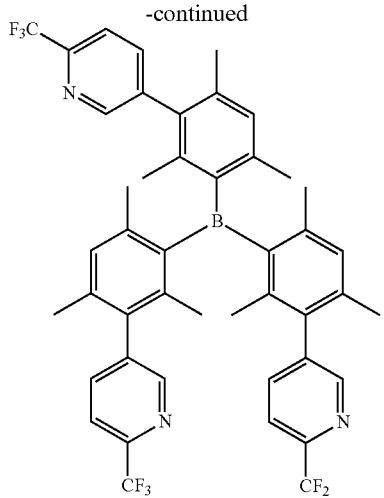

PADN-BI-3CF3

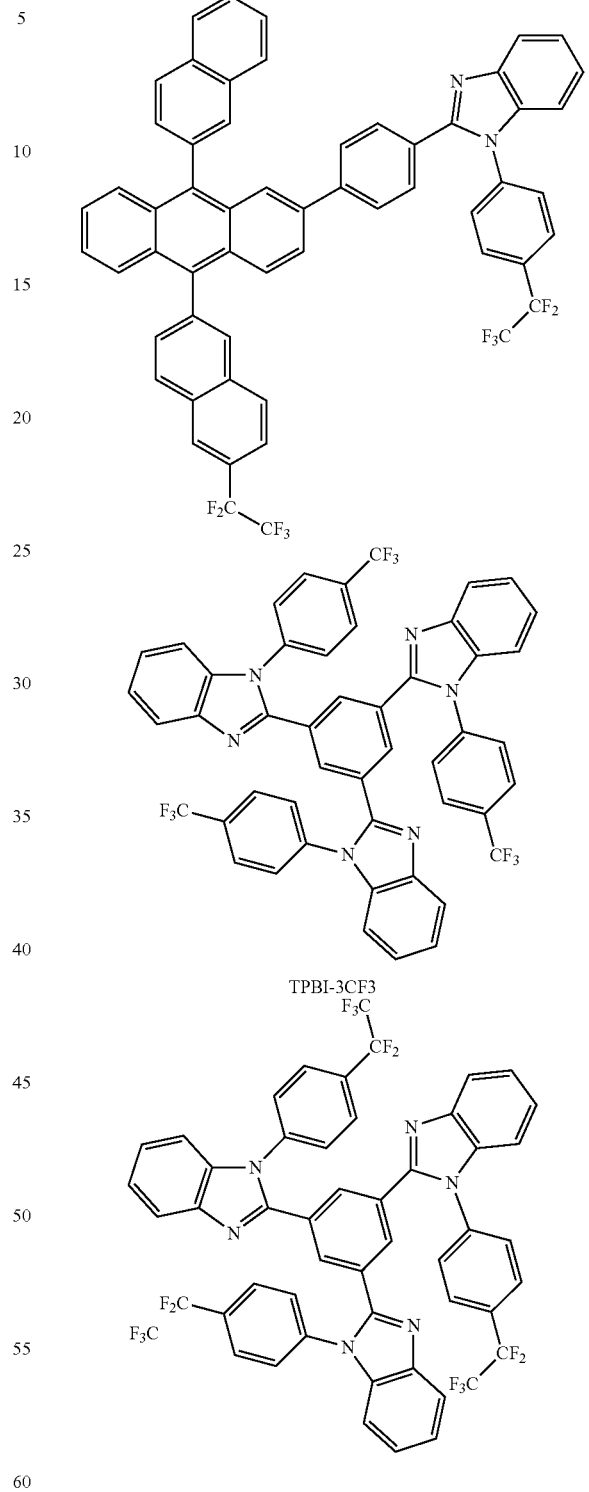

TPBI-3CF3

Solvent

The solvent can be at least one solvent adapted for use and processing with other layers, such as the anode or light emitting layer, when the ink is used to form a film in a device.

Common solvents used in the present solvent system include aromatic hydrocarbons in the neutral and oxidized forms. Solvents such as tetrahydrofuran, chloroform, or aromatic hydrocarbons in the neutral and oxidized forms are used. Additional solvents include tetrahydrofuran, chloroform, alkylated benzenes, halogenated benzenes, NMP, DMF, DMAc, DMSO, methyl ethyl ketone, cyclohexanone, chloroform, dichloromethane, acetone, THF, dioxanes, ethyl acetate, ethyl benzoate, ethylene carbonate, propylene carbonate, or combinations thereof. The conjugated polymer is typically highly soluble and highly processable in these solvents.

For environmental compliance, one or more nonhalogenated solvents may be selected. Halogenated solvents can be substantially or totally excluded (e.g., used in less than 10%, or less than 5%, or less than 1%, or less than 0.1% by volume of total solvent carrier. In weighing such additional factors, it may be helpful to consult references such as, for example, Cheremisnoff, N. P., *Industrial Solvents Handbook,* 2nd Ed. (Marcel Dekker, New York, 2003); Ash, M, *Handbook of Solvents,* 2nd Ed. (Syapse Information Resources, 2003); Wypych, G., *Handbook of Solvents (Chemical)* (Noyes Publications, 2000); Hansen, C. M., Durkee, J. and Kontogeorgis, G, *Hanson Solubility Parameters: A User's Handbook* (Taylor and Francis, 2007); all of which are incorporated by reference in their entireties. For a more detailed discussion regarding selection of solvent systems comprising two or more solvents, see U.S. 61/090,464, filed Aug. 20, 2008, (043419-0256) which is incorporated by reference it its entirety.

Solvents to be considered may include ethers (optionally substituted with C1-C10 alkyl chains) such as anisole, ethoxybenzene, dimethoxy benzenes and glycol ethers, such as: ethylene glycol diethers such as 1,2-dimethoxy ethane, 1,2-diethoxy ethane, 1,2-dibutoxy ethane; diethylene glycol diethers such as diethylene glycol dimethyl ether, diethylene glycol diethyl ether; propylene glycol diethers such as propylene glycol dimethyl ether, propylene glycol diethyl ether, propylene glycol dibutyl ether; dipropylene glycol diethers such as dipropylene glycol dimethyl ether, dipropylene glycol diethyl ether, dipropylene glycol dibutyl ether; also, higher analogs (tri- and tetra-) of the ethylene glycol and propylene glycol ethers mentioned above.

Still other solvents can be considered, such as ethylene glycol monoether acetates and propylene glycol monoether acetates, wherein the ether can be selected, for example, from: methyl, ethyl, n-propyl, iso-propyl, n-butyl, sec-butyl, tert-butyl, cyclohexyl. Also, higher glycol ether analogs of above list such as di-, tri- and tetra-. Examples include, but are not limited to, propylene glycol methyl ether acetate, 2-ethoxyethyl acetate, 2-butoxyethyl acetate.

Yet other possible solvents include aliphatic and aromatic ketones such as acetonyl acetone, methyl isobutyl ketone, methyl isobutenyl ketone, 2-hexanone, 2-pentanone, acetophenone, ethyl phenyl ketone, cyclohexanone, cyclopentanone.

Additional possible solvents include N,N-dimethyl formamide, N,N-dimethyl acetamide, N-methylpyrrolidone, dimethyl sulfoxide, tetramethylene sulfoxide, acetonitrile, benzonitrile, ethylene carbonate, propylene carbonate, and the like.

Other examples include cyclic ethers such as, for example, tetrahydropyran (THP). Solvent can be used such that polymerization of the solvent can be avoided. Another example is methoxyproprionitrile.

The one or more solvents can be used in varying proportions to improve the ink characteristics such as substrate wettability, ease of solvent removal, viscosity, surface tension, and wettability.

Alternatively, it may be useful to select more than one solvent, for example, a first solvent and a second solvent. In one example, in a HIL/HTL ink system, the conjugated polymer can have a higher solubility in the first solvent than in the second solvent. The hole transporting compound can also have a higher solubility in the second solvent than in the first solvent. The solvent can be selected such that the first solvent can be removed at a faster rate than the second solvent in a drying step. Likewise, in a HTL 1/HTL 2 ink system the HTM 1 can have a higher solubility in the first solvent than in the second solvent. The HTM 2 can also have a higher solubility in the second solvent than in the first solvent. The solvent can be selected such that the first solvent can be removed at a faster rate than the second solvent in a drying step. Likewise, in an ETL/EML ink system the EM can have a higher solubility in the first solvent than in the second solvent. The ETM can also have a higher solubility in the second solvent than in the first solvent. The solvent can be selected such that the first solvent can be removed at a faster rate than the second solvent in a drying step.

Vertical Phase Separation

The ink composition can be coated and dried on an electrode or on one or more layers comprising at least one semiconducting organic material, such as for example, a hole injecting layer or a hole transporting layer that was previously deposited on the substrate/electrode or other previously deposited semiconducting organic material layer.

The ink composition can be formed as a film on a substrate, optionally containing an electrode or additional layers used to improve electronic properties of a final device. For example, the composition can be formulated such it phase separates. Phase separation generally, and vertical phase separation specifically, is known in the art. See for example: Arias, A. C., et al., "Photovoltaic Performance and Morphology of Polyfluorene Blends: A combined Microscopic and Photovoltaic Investigation," *Macromolecules,* 2001, 34, 6005-6013; Walheim, S., et al. "Structure Formation via Polymer Demixing in Spin-Cast Films," *Macromolecules,* 1997, 30, 4995-5003; Coe-Sullivan, S., et al., "Large-Area Ordered Quantum-Dot Monolayers via Phase Separation During Spin-Casting," *Adv. Func. Mater.,* 2005, 15, 1117-1124; Arias, A. C., "Vertically Segregated Polymer Blends: Their Use in Organic Electronics," *Journal of Macromolecular Science, Part C. Polymer Reviews,* 46:103-125, 2006; Corcoran, N., et al., "Increased efficiency in vertically segregated thin-film conjugated polymer blends for light-emitting diodes," *App. Phys. Lett.,* Vol. 82, No. 2, 2003; Heriot, S Y., et al., "An interfacial instability in a transient wetting layer leads to lateral phase separation in thin spin-cast polymer blend films," *Nature,* Vol. 4, October 2005; Kim, Y, et al., "Mixing effect of hole-injecting and hole transporting materials on the performance and lifetime of organic light-emitting devices," *App. Phys. Lett.,* 88, 043504 (2006); Sun, 8., et al., "Vertically segregated hybrid blends for photovoltaic devices with improved efficiency," *J Appl. Phys.,* 97, 014914 (2005); Arias, A. C., et al., "Vertically segregated polymer-blend photovoltaic thin-film structures through surface-mediated solution processing," *Appl. Phys. Lett., Vol.* 80, No. 10, March 2002, Greczynski, G., et al., "Characterization of the PEDOT-PSS system by means of X-ray and Ultraviolet Photoelectron Spectroscopy," *Thin Solid Films, Vol.* 354, Nos. 1-2, October 1999, and Hwang, J., "Spectroscopic study on sputtered PEDOT-PSS: Role of surface PSS layer," *Org. Electronics,* Vol. 7, No. 5, October 2006.

Thus, the ink composition can be used to form a phase-separated film comprising at least one lower first layer, and at least one upper second layer different from the first layer and disposed on the first layer.

The at least one lower first layer can be disposed on the substrate such as an electrode or one or more layers comprising at least one semiconducting organic material, such as for example, a hole injecting layer or a hole transporting layer that was previously deposited on the substrate/electrode or other previously deposited semiconducting organic material layer. The first layer can be enriched with at least one first semiconducting organic material (SOM 1), such as at least one hole injection material such as, for example, conjugated polymer, or at least one first hole transporting material (HTM 1) or at least one emissive material (EM). For example, the first layer can comprise at least 30%, or at least 50%, or at least 70%, or at least 90% by wt. of SOM 1.

The at least one upper second layer can be different from the first layer and can be disposed away from the substrate such as electrode. The second layer can be enriched by a second semiconducting organic material (SOM 2) different from the SOM 1. The second layer can be a hole transporting layer or at least one second hole transporting material different from HTM 1 or at least one electron transporting material (ETM), of a device. The second layer can comprise at least 30%, or at least 50%, or at least 70%, or at least 90%, or at least 95%, or at least 99%, by wt., of SOM 2. The second layer can have a hole mobility of $10^{-3}$ to $10^{-6}$ cm$^2$V$^{-1}$S$^{-1}$ when a hole transporting layer. The second layer can have a LUMO of 2.0 to 1.8 eV. The second layer preferably does not experience any thermal transitions (i.e., melting, glass transition, or decomposition) at temperatures below about 200° C., or below about 150° C., or below about 100° C. The second layer does not experience any contractions.

The second layer preferably comprises a SOM 2 capable of self-surfacing during a drying step of the ink composition to form a SOM 2, such as an undoped hole transport layer. The second layer preferably comprises SOM 2, such as a hole transporting compound capable of being subsequently coated by an emissive layer comprising an emitter and host dissolved in, for example, toluene or xylene. For example, when enriched with a hole transporting compound, the second layer should be capable of providing a smooth and wettable surface onto which an emitter layer (EML) is formed. Thus, subsequent coating by an emitter dissolved in toluene and xylene should not affect the initial surface roughness of the second layer. It is desirable that a hole transporting layer will be 100% retained when coated with an emissive layer from toluene or xylene (for example). It is at least desirable that greater than 90%, or greater than 95%, of the HTL is retained. The hole transporting compound can retain at least 90% of the initial film thickness after a toluene wash on the coated substrate, where the toluene wash step can include spinning toluene for one minute on the substrate and anneal the substrate at 100° C. for 5 min to dry the substrate. When used as a hole transporting layer in a phosphorescent OLED device, the second layer may also be adapted for triplet exciton blocking.

While not limited by any particular theory on the process of phase separation, phase separation can occur during, for example, a drying step. Phase separation can be initiated by the removal of solvent such that at least one of the ink components precipitates out. Drivers for phase separation include the use of self-surfacing semiconducting organic material (i.e. SOM 2) (e.g. a hole transport compound), semiconducting organic materials (i.e. SOM 2) that have a partial solubility in a low vapor pressure solvent, for example in a solvent system including at least one solvent, such as a first solvent and a second solvent, wherein a vapor pressure of the second solvent is lower than the first solvent. Partial fluorination and hydrogen bonding of, for example, the semiconducting organic material (i.e. SOM 2), are features that provide a self-surfacing layer of a vertically phase separating film. Hydrogen bonding groups such as hydroxyl are known in the art. Additionally, ionic/acidic interactions between components of an ink composition can assist the ink in forming a vertically phase separating film. Ammonium groups are an example of ionic groups.

Material parameters that can also control phase separation are the surface energy, differential solubility, solvent volatility, solvent viscosity, and the specific interactions between the substrate, ink and the atmosphere.

Additionally, the substrate surface onto which ink compositions of the embodiments are deposited for forming a film, such as a vertically phase separated film, can be functionalized to promote vertical phase separation. For example, an ITO electrode formed over a glass substrate can be functionalized such that the surface preferably binds to, for example, the conjugated polymer of a HIM first layer, allowing the hole transporting compound to surface on top and thereby form a second upper layer as described above.

Several methods are available for characterizing the phase separated film such as optical microscopy, X-ray photoelectron spectroscopy (XPS), Fourier transform spectroscopy (FTIR), atomic force microscopy (AFM) and conductive AFM. Phase separation can be verified by comparing measurements of films formed from compositions comprising only the semiconducting organic material (i.e. SOM 2) to those of films formed by ink compositions of the embodiments using these characterization methods.

Amounts

Ink Compositions can be provided in the amounts shown in Table 2 below. The amounts for each component can be varied including varied up to 25% from the particular recipes shown. The amounts are disclosed in wt %.

TABLE 2

| | (HIL/HTL) | |
|---|---|---|
| 1 | CE1 | 0.375 |
| | C9f13-TPD | 1.125 |
| | Tetrahydropyran | 98.5 |
| 2 | CE1 | 0.75 |
| | C9f13-TPD | 0.75 |
| | Tetrahydropyran | 98.5 |
| 3 | CE1 | 1.125 |
| | C9f13-TPD | 0.375 |
| | Tetrahydropyran | 98.5 |
| 4 | CE1 | 0.375 |
| | C9f13-TPD | 1.125 |
| | Tetrahydropyran | 32.83 |
| | 3-methoxypropionitrile | 65.67 |
| 5 | CE1 | 0.75 |
| | C9f13-TPD | 0.75 |
| | Tetrahydropyran | 32.83 |
| | 3-methoxypropionitrile | 65.67 |
| 6 | CE1 | 1.125 |
| | C9f13-TPD | 0.375 |
| | Tetrahydropyran | 32.83 |
| | 3-methoxypropionitrile | 65.67 |
| 7 | CE1 | 0.375 |
| | Sty-TPD | 1.125 |
| | Tetrahydropyran | 98.5 |
| 8 | CE1 | 0.75 |
| | Sty-TPD | 0.75 |
| | Tetrahydropyran | 98.5 |
| 9 | CE1 | 1.125 |
| | Sty-TPD | 0.375 |
| | Tetrahydropyran | 98.5 |
| 10 | CE1 | 0.375 |
| | Sty-TPD | 1.125 |
| | Tetrahydropyran | 32.83 |
| | 3-methoxypropionitrile | 65.67 |

TABLE 2-continued (HIL/HTL)

| | | |
|---|---|---|
| 11 | CE1 | 0.75 |
| | Sty-TPD | 0.75 |
| | Tetrahydropyran | 32.83 |
| | 3-methoxypropionitrile | 65.67 |
| 12 | CE1 | 1.125 |
| | Sty-TPD | 0.375 |
| | Tetrahydropyran | 32.83 |
| | 3-methoxypropionitrile | 65.67 |
| 13 | CE1 | 0.375 |
| | TFB | 1.125 |
| | Tetrahydropyran | 98.5 |
| 14 | CE1 | 0.75 |
| | TFB | 0.75 |
| | Tetrahydropyran | 98.5 |
| 15 | CE1 | 1.125 |
| | TFB | 0.375 |
| | Tetrahydropyran | 98.5 |
| 16 | CE1 | 0.375 |
| | TFB | 1.125 |
| | Tetrahydropyran | 32.83 |
| | 3-methoxypropionitrile | 65.67 |
| 17 | CE1 | 0.75 |
| | TFB | 0.75 |
| | Tetrahydropyran | 32.83 |
| | 3-methoxypropionitrile | 65.67 |
| 18 | CE1 | 1.125 |
| | TFB | 0.375 |
| | Tetrahydropyran | 32.83 |
| | 3-methoxypropionitrile | 65.67 |

Ink Compositions can be provided in the amounts shown in Table 3 below for a dual HTL. The amounts for each component can be varied including varied up to 25% from the particular recipes shown. The amounts are disclosed in wt %.

TABLE 3

(HTL1/HTL2)

| | | |
|---|---|---|
| 1 | BCBz-2CF3 | 0.375 |
| | HTM1 | 1.125 |
| | toluene | 98.5 |
| 2 | TCTA-4CF3 | 0.75 |
| | HTM2 | 0.75 |
| | toluene | 98.5 |
| 3 | TP-F5Et | 1.125 |
| | HTM1 | 0.375 |
| | toluene | 98.5 |

Ink Compositions can be provided in the amounts shown in Table 4 below for a blooming ETL EML. The amounts for each component can be varied including varied up to 25% from the particular recipes shown. The amounts are disclosed in wt %.

TABLE 4

EML/ETL

| | | |
|---|---|---|
| 1 | PADN-BI-3CF3 | 0.375 |
| | EML | 1.125 |
| | toluene | 98.5 |
| 2 | TPBI-3CF3 | 0.75 |
| | EML | 0.75 |
| | Tetrahydropyran | 98.5 |
| 3 | BPHEN-2CF3 | 1.125 |
| | EML | 0.375 |
| | Tetrahydropyran | 98.5 |

Method of Making

In one embodiment, a method of making a liquid ink composition is provided.

One embodiment of the method includes the steps of providing at least one solvent, providing at least one hole injection material (such as, for example, conjugated polymer) to the solvent, optionally providing to the solvent at least one matrix material different than the hole injection material, providing to the solvent at least one dopant for the conjugated polymer, wherein the dopant does not substantially dope the optional matrix material, and the dopant comprises an ionic compound and providing to the solvent at least one hole transporting compound different from the hole injection material and the matrix material.

Another embodiment of the method includes the steps of providing at least one solvent, providing at least one first hole transporting material (HTM 1) to the solvent, optionally providing to the solvent at least one matrix material different than the HTM 1, and providing to the solvent at least one second hole transporting material (HTM 2) different from the HTM 1 and the matrix material.

Another embodiment of the method includes the steps of providing at least one solvent, providing at least one emissive material (EM) and providing to the solvent at least one electron transporting material (ETM) different from the EM.

Devices (Methods of Using)

Methods known in the art can be used to fabricate organic electronic devices including for example OLED and OPV devices. Methods known in the art can be used to measure brightness, efficiency, and lifetimes. OLED patents include for example U.S. Pat. Nos. 4,356,429 and 4,539,507 (Kodak). Conducting polymers which emit light are described in for example U.S. Pat. Nos. 5,247,190 and 5,401,827 (Cambridge Display Technologies). See also Kraft et al., "Electroluminescent Conjugated Polymers—Seeing Polymers in a New Light," *Angew. Chem. Int. Ed.*, 1998, 37, 402-428, including device architecture, physical principles, solution processing, multilayering, blends, and materials synthesis and formulation, which is hereby incorporated by reference in its entirety.

Representative diagrams of some of the embodiments included herein are found in FIGS. 1(B) to 1(D).

In one embodiment, the device can have a layer consisting of one or more of the compositions embodied herein. In another embodiment, the device comprises: at least one substrate; at least one conductive electrode disposed on the substrate; optionally, one or more semi-conductive layers disposed on the conductive electrode; an organic semi-conductive layer having an upper and a lower surface disposed on the conductive electrode or optional semi-conductive layer, comprising at least one first semiconducting organic material (SOM 1) and at least one second semiconducting organic material (SOM 2) different from the SOM 1, wherein the lower boundary is the surface that is at least partially in contact with the conductive electrode or optional semi-conductive layer and the upper surface is furthest from the lower boundary, and the SOM 2 is present in a higher weight percent at the upper surface than at the lower surface. As a means of further clarification the lower surface, as used herein can be for example, the surface of the HTL/HIL layer that is in contact with the ITO in FIG. 1B, or the HTL 1/HTL 2 surface in contact with the HIL in FIG. 1C, or the ETL/EM surface in contact with the HTL layer in 1D. Likewise, the upper surface can be for example, the surface of the HTL/HIL layer that is in contact with the EM in FIG. 1B, or the HTL 1/HTL 2 surface in contact with the EM in FIG. 1C, or the ETL/EM surface in contact with the cathode layer in 1D. It is understood that the figures are merely representative of some embodiments, and the upper surface is generally enriched in the surfacing compound. In some embodiments, the organic semi-conductive layer having an upper and a lower surface consist of one or more of the compounds embodied herein. The organic semi-conductive layer can comprise a first semi-conducting organic material (SOM 1) and a second semiconducting organic material (SOM 2) different from the SOM 1.

Light Emitters

A layer comprising a light emitter can be formed over the at least one hole injection material (HIM) and at least one hole transporting material (HTM) or at least one first hole transporting material (HTM 1) and at least one second hole transporting material (HTM 2) films described above. Light emitters known in the art and commercially available can be used including various conducting polymers as well as organic molecules, such as materials available from Sumation, Merck Yellow, Merck Blue, American Dye Sources (ADS), Kodak (e.g, AlQ3 and the like), and even Aldrich such as BERP-PPV. Examples of such organic electroluminescent materials include: (i) poly(p-phenylene vinylene) and its derivatives substituted at various positions on the phenylene moiety; (ii) polyp-phenylene vinylene) and its derivatives substituted at various positions on the vinylene moiety; (iii) polyp-phenylene vinylene) and its derivatives substituted at various positions on the phenylene moiety and also substituted at various positions on the vinylene moiety; (iv) poly(arylene vinylene), where the arylene may be such moieties as naphthalene, anthracene, furylene, thienylene, oxadiazole, and the like; (v) derivatives of poly(arylene vinylene), where the arylene may be as in (iv) above, and additionally have substituents at various positions on the arylene; (vi) derivatives of poly(arylene vinylene), where the arylene may be as in (iv) above, and additionally have substituents at various positions on the vinylene; (vii) derivatives of poly(arylene vinylene), where the arylene may be as in (iv) above, and additionally have substituents at various positions on the arylene and substituents at various positions on the vinylene; (viii) co-polymers of arylene vinylene oligomers, such as those in (iv), (v), (vi), and (vii) with non-conjugated oligomers; (ix) polyp-phenylene and its derivatives substituted at various positions on the phenylene moiety, including ladder polymer derivatives such as poly(9,9-dialkyl fluorene) and the like; (x) poly (arylenes) where the arylene may be such moieties as naphthalene, anthracene, furylene, thienylene, oxadiazole, and the like; and their derivatives substituted at various positions on the arylene moiety; (xi) co-polymers of oligoarylenes such as those in (x) with non-conjugated oligomers; (xii) polyquinoline and its derivatives; (xiii) co-polymers of polyquinoline with p-phenylene substituted on the phenylene with, for example, alkyl or alkoxy groups to provide solubility; (xiv) rigid rod polymers such as poly(p-phenylene-2,6-benzobisthiazole), poly(pphenylene-2,6-benzobisoxazole), polyp-phenylene-2,6-benzimidazole), and their derivatives; (xv) polyfluorene polymers and co-polymers with polyfluorene units.

Preferred organic emissive polymers include SUMATION Light Emitting Polymers ("LEPs") that emit green, red, blue, or white light or their families, copolymers, derivatives, or mixtures thereof; the SUMATION LEPs are available from Sumation KK. Other polymers include polyspirofluorene-like polymers available from Covion Organic Semiconductors GmbH, Frankfurt, Germany (now owned by Merck®).

Alternatively, rather than polymers, small organic molecules that emit by fluorescence or by phosphorescence can serve as the organic electroluminescent layer. Examples of small-molecule organic electroluminescent materials include: (i) tris(8-hydroxyquinolinato) aluminum (Alq); (ii) 1,3-bis(N,N-dimethylaminophenyl)-1,3,4-oxidazole (OXD-8); (iii) -oxo-bis(2-methyl-8-quinolinato)aluminum; (iv) bis (2-methyl-8-hydroxyquinolinato) aluminum; (v) bis(hydroxybenzoquinolinato) beryllium ($BeQ_2$); (vi) bis (diphenylvinyl)biphenylene (DPVBI); and (vii) arylamine-substituted distyrylarylene (DSA amine).

Such polymer and small-molecule materials are well known in the art and are described in, for example, U.S. Pat. No. 5,047,687 issued to VanSlyke; and Bredas, J.-L., Silbey, R., eds., Conjugated Polymers, Kluwer Academic Press, Dordrecht (1991).

Examples of HIL in devices include:

(1) Hole injection in OLEDs including PLEDs and SMOLEDs; for example, for HIL in PLED, all classes of conjugated polymeric emitters where the conjugation involves carbon or silicon atoms can be used. For HIL in SMOLED, the following are examples: SMOLED containing fluorescent emitters; SMOLED containing phosphorescent emitters; SMOLEDs comprising one or more organic layers in addition to the HIL layer; and SMOLEDs where the small molecule layer is processed from solution or aerosol spray or any other processing methodology. In addition, other examples include HIL in dendrimer or oligomeric organic semiconductor based OLEDs; HIL in ambipolar light emitting FET's where the HIL is used to modify charge injection or as an electrode;

(2) Hole extraction layer in OPV;

(3) Channel material in transistors;

(4) Channel material in circuits comprising a combination of transistors such as logic gates;

(5) Electrode material in transistors;

(6) Gate layer in a capacitor;

(7) Chemical sensor where modification of doping level is achieved due to association of the species to be sensed with the conductive polymer.

A variety of photoactive layers can be used in OPV devices. Photovoltaic devices can be prepared with photoactive layers comprising fullerene derivatives mixed, for example, with conducting polymers as described in for example U.S. Pat. No. 5,454,880 (Univ. Cal.); U.S. Pat. Nos. 6,812,399; and 6,933,436. See also, for example, Wienk et al., *Applied Physics Letters,* 88, 153511 (2006); Campos et al., *Solar Energy Materials & Solar Cells,* 90 (2006) 3531-3546. In addition, photoactive layers may comprise blends of conducting polymers, blends of conducting polymers and semiconducting nanoparticles, and bilayers of small molecules such as pthalocyanines, fullerenes, and porphyrins.

Common electrode materials and substrates such as those described above, for example, as well as encapsulating materials can be used.

Interfacial modification layers and optical spacer layers can be used.

Electron transport layers can be used.

As shown in FIG. 1A, conventional OLED devices require forming an HIL and HTL during two separate coating event (i.e., a two-step process). For example, an HIL is formed on ITO and then dried. Subsequently, an HTL is formed and dried. In embodiments described herein, however, a single coating event provides the HTL and HIL as shown in FIG. 18. In one embodiment, the HTL and HIL phase separate into distinct layers separated by an interface. In other embodiments, a graded HIL-HTL layer may form below the HTL.

I-V Measurements

The OLEDs can comprise pixels on a glass substrate whose electrodes extended outside the encapsulated area of the device which contain the light emitting portion of the pixels. The typical area of each pixel is 0.05 $cm^2$. The electrodes were contacted with a current source meter such as a Keithley 2400 source meter with a bias applied to the indium tin oxide electrode while the aluminum electrode was earthed. This results in positively charged carriers (holes) and negatively charged carriers being injected into the device which form excitons and generate light. In this example, the HIL assists the injection of charge carriers into the light emitting layer. This results in a low operating voltage of the device (defined as the voltage required to run a given current density through the pixel).

Simultaneously, another Keithley 2400 source meter was used to address a large area silicon photodiode. This photodiode was maintained at zero volts bias by the 2400 source meter. It is placed in direct contact with area of the glass substrate directly below the lighted area of the OLED pixel. The photodiode collected the light generated by the OLED converting them into photocurrent which is in turn read by the source meter. The photodiode current generated is quantified into optical units (candelas/sq. meter) by calibrating it with the help of a Minolta CS-200 Chromometer.

During the testing of the device, the Keithley 2400 addressing the OLED pixel applied a voltage sweep to it. The resultant current passing through the pixel was measured. At the same time the current passing through the OLED pixel results in light being generated which then results in a photocurrent reading by the other Keithley 2400 connected to the photodiode. Thus the voltage-current-light or IVL data for the pixel was generated. This in turn enables the measurement of other device characteristics such as the lumens per Watt of electrical input power to the pixel and candelas per ampere of pixel current.

The performance of different HILs in different example OLED types is described. Note that typically performance is quantified by a combination of different parameters such as operating voltage (should be low), brightness in nits (should be bright, luminous efficiency in units of cd/A (reflecting how much electric charge is needed to obtain light from the device) and the lifetime under operation (time required to reach half of the initial luminance value at the start of the test). As such, the overall performance is very important in a comparative evaluation of HIL performance.

Film Characterization Studies

Preparation of Oxidized Polythiophene Ink (CE1)

A stock solution of poly(3,4-(dibutoxyethoxyethoxy) thiophene)) in tetrahydropyran is prepared at 0.5% solids by stirring at room temperature for 30-60 min. About 0.5 g of Silver powder (5-8 micron) is added per 20 mL of solution. The required amount of the above solution is weighed into a clean flask and the appropriate amount of silver tetrakis(pentafluorophenyl)-borate dissolved in tetrahydropyran at 0.5% solids is added dropwise with agitation. The mixture is stirred at room temperature for an additional 30 min and filtered through two or more 0.5 micron glass fiber filter. The solution is kept standing for additional 2 days to complete the oxidation process and filtered once again through a 0.5 micron glass fiber filter. The solid content of the ink is measured and the ink is then concentrated at low pressure while keeping the temperature between 25-40° C. to the desired concentration (for example, 1.5%).

Example 1

Ink Composition

A stock solution of N4,N4'-bis(4-tridecafluorononyloxyphenyl)-N4,N4'-diphenyl-[1,1-biphenyl]-4,4'-diamine (C9fl3-TPD) is prepared in tetrahydropyran at 1.5%. To a pre-weighed amount of the oxidized polythiophene ink described above, the C9fl3-TPD solution is added with or without stirring. The solution is then mixed thoroughly in a shaker or by simple agitation using a stirrer. The weight percentage of the C9fl3-TPD can be 5, 10, 25, 50, 75 or 90% of the total solids in the ink. The resulting composition was formed on a substrate by spin-coating and allowed to dry. The film was annealed at 175° C.

Example 2

Ink Composition

A stock solution of N4,N4'-bis(4-vinylphenyl)-N4,N4'-diphenyl-[1,1'-biphenyl]-4,4'diamine (Sty-TPD) is prepared in tetrahydropyran at 1.5%. To a pre-weighed amount of the oxidized polythiophene ink, the C9fl3-TPD solution is added with or without stirring. The solution is then mixed thoroughly in a shaker or by simple agitation using a stirrer. The weight percentage of the C9fl3-TPD can be 5, 10, 25, 50, 75 or 90% of the total solids in the ink. The resulting composition was formed on a substrate and allowed to dry. The resulting composition was formed on a substrate by spin-coating and allowed to dry. The film was annealed at 175° C.

Example 3

Ink Composition

A stock solution of poly(9,9-dioctyl-fluorene-co-N-(4-butylphenyl)-diphenylamine) (TFB) is prepared in tetrahydropyran at 1.5%. To a pre-weighed amount of the oxidized polythiophene ink, the TFB solution is added with or without stirring. The solution is then mixed thoroughly in a shaker or by simple agitation using a stirrer. The weight percentage of the TFB can be 5, 10, 25, 50, 75 or 90% of the total solids in the ink. The resulting composition was formed on a substrate and allowed to dry. The resulting composition was formed on a substrate by spin-coating and allowed to dry. The film was annealed at 175° C.

Comparative Example 1

The oxidized conjugated polymer ink is spin-coated onto a substrate, allowed to dry and annealed at 175° C.

Comparative Example 2

A stock solution of C9fl3-TPD is prepared in tetrahydropyran at 1.5%, spin-coated onto a substrate, allowed to dry and annealed at 175° C.

Comparative Example 3

A stock solution of Sty-TPD) is prepared in tetrahydropyran at 1.5%, spin-coated onto a substrate, allowed to dry and annealed at 175° C.

Comparative Example 4

A stock solution of TFB is prepared in tetrahydropyran at 1.5%, spin-coated onto a substrate, allowed to dry and annealed at 175° C.

Characterization Example 1

FTIR

To evaluate the degree of vertical phase separation between the conjugated polymer and the hole transport compound FTIR spectra is collected for the films of Examples 1-3. FTIR spectra is also collected for each of the films of comparative examples 1-4.

The spectra obtained from these three samples are compared. Preferably, vertical phase separation is found to be adequate when the spectra for examples 1-3 substantially matches with that of comparative examples 2-4, respectively.

Different annealing temperatures and times can be used in the preparation of films for Examples 1-3 and comparative examples 1-4.

The spectra can be measured at varying angles, for example at small angles to probe the surface and at larger angles to determine if the upper second layer is thick enough to serve as an hole transport layer.

Characterization Example 2

XPS

XPS spectra of films formed in Examples 1-3 are measured. Elemental analysis is performed to track the peaks of sulfur and nitrogen at the surface. Phase separation is adequate if sulfur is not detected as this implies that surface is rich in a material other than the oxidized polythiophene.

In addition, variable angle analysis similar to FTIR can be used to do depth and surface analysis.

Characterization Example 3

AFM

The morphology of the three films of examples 1-3 are characterized and compared using AFM. Additional films using the formulations of examples 1-3 except formed at various annealing temperatures and for different annealing times can be provided.

A change in AFM morphology is indicative of a phase separation. For example, at non-preferred annealing times and temperatures, islands of hole transport compound appear at the surface but do not provide complete coverage. Preferably, adequate phase separation is present when the hole transport compound appears as a homogeneous and uniform surface.

Characterization Example 4

Conductive AFM

The conductivities of the first layer comprising the conjugated polymer and the second upper layer comprising the hole transport compound are very different. Conductive-AFM (CAFM) is a useful tool in characterizing these vertical phase separations. C-AFM measurements of films formed in Examples 1-3 are recorded. Phase separation is determined to be adequate when the C-AFM measurements of Examples 1-3 yields C-AFM maps substantially similar to C-AFM measurements of Comparative Examples 2-4. At a minimum, adequate phase separation of Examples 1-3 is present if the C-AFM measurements are substantially different than the CAFM measurement of Comparative Example 1.

Characterization Example 5

AC2

AC2 can be used to measure the HOMO energy of films of Examples 1-3, and comparative Examples 1-4. The surface HOMO energy will be used to characterize the top film.

Examples 4-6

OLED Device Fabrication

Three different OLED Devices were made, one each for Examples 4-6.

The OLED devices include an indium tin oxide (ITO) electrode deposited on glass substrates. The ITO surface was pre-patterned to define the pixel area of 0.05 $cm^2$. The device substrates were cleaned by ultrasonication in a dilute soap solution for 20 minutes each followed by distilled water washes. This was followed by ultrasonication in isopropanol for 20 minutes. The substrates were dried under nitrogen flow, following which they were treated in a UV-Ozone chamber operating at 300 W for 20 minutes.

The cleaned substrates were then coated with an HIL and HTL ink composition and dried at 90-170° C. for 5-15 minutes to form a phase separated film comprising an HIL layer (i.e., first layer enriched with a conjugated polymer) and HTL layer (i.e., second upper layer enriched with a hole transport compound). For example, the ink compositions of Examples 1-3 can be used to form the phase separated films.

Dry film thicknesses ranged from approximately 5 nm to 100 nm, or 5 nm to 70 nm, or 10 nm to 100 nm, or 10 nm to 70 nm. The coating process was done on a spin coater but can be similarly achieved with spray coating, ink-jetting, contact printing or any other deposition method capable of resulting in an HIL film of the desired thickness. The substrates were then transferred to a vacuum chamber where the remaining layers of the device stack were deposited by means of physical vapor deposition.

In one example, the layers deposited on top of the phase-separated film include an emissive layer (EML), a hole blocking layer (HBL), an electron transporting layer (ETL), and a metal cathode. The materials used in this example were Bis (2-methyl-8-quinolinolato-N1,O8)-(1,1'-Biphenyl-4-olato) aluminum (BAlq) doped with Tris-(1-phenylisoquinoline) iridium III $(Ir(piq)_3)$ for the EML, BAlq as the HBL, and tris(8-hydroxyquinoline) aluminium (Alq3) as the ETL. All of these materials are commercially available and typically found in OLED structures in the art.

Also in this example, the cathode layer was prepared by the sequential deposition of two metal layers, the first being a 3 nm to 5 nm layer of Ca (0.1 nm/sec) followed by a 200 nm layer of Al (0.5 nm/sec) with the base pressure at $5 \times 10^{-7}$ Torr.

The devices thus obtained were encapsulated with a glass cover slip to prevent exposure to ambient conditions by means of a UV-light curing epoxy resin cured at 80 W/$cm^2$ UV exposure for 4 minutes.

Examples 7-9; Comparative Examples 5-8

Hole Only Devices

Ink formulations of Examples 1-3 are used to form a film of a hole only device in each of Examples 7-9, respectively Ink formulations of Comparative Examples 1-4 are used to form a film of a hole only device in each of Comparative Examples 5-8, respectively. The hole only devices have the device architecture: Glass/ITO/film/Au.

The hole only device of Comparative Example 5 has a very high current density and does not show diode behavior. The hole only devices of Comparative Examples 6-8 show diode behavior with poor charge injection. The hole only devices of Examples 7-9 exhibit a combination of the two diode behavior with largely improved hole injection. Lifetime studies are performed to evaluate the stability of the interface of the phase separated film of Examples 7-9.

Example 10-12

Impedance Spectroscopy of Hole Only Device Testing

Impedance spectroscopy measurements of the hole only devices are made to estimate the thickness of the HTL layer. This is possible because the entire voltage drop should be across HTL layer as HIL is conducting in nature. Impedance spectroscopy can be used to measure the dielectric properties of a material/film as a function of frequency and voltage. For impedance measurements, the HIL/HTL coated samples can be deposited with a top gold/silver electrode to fabricate a single carrier device (to block electron injection). In case of a thin, semiconducting layer surfacing at the top, a finite geometrical capacitance will be measured from the device which will vanish as the charge carriers are injected. For a known material with predetermined dielectric constant, the thickness can be calculated from a capacitance frequency measurement (particularly for films greater than 20-30 nm thickness). The thickness as determined by impedance spectroscopy may be corroborated by a second method such as, for example, XPS.

Additional Comparative Examples

OLEDs can be fabricated with the optimized HIL/HTL combinations to compare performance with devices where HIL and HTL are coated in separate steps.

Additional HIL/HTL Embodiments

The following 64 claims were described in the priority U.S. provisional application 61/504,653 filed Jul. 5, 2011 and are incorporated by reference in their entirety as 64 embodiments:

1. A composition comprising: at least one hole injection material; at least one hole transporting material different from the hole injection material; at least one solvent system, wherein the hole transport material is functionalized to encourage surface enrichment of the hole transporting material away from the substrate when the solvent system is removed and a film is formed on a substrate.
2. The composition of embodiment 1, wherein the hole transporting material is an arylamine.
3. The composition of embodiment 1, wherein the hole transport material is functionalized with at least one fluorinated group, at least one alkyl group, and/or at least one siloxyl group.
4. The composition of embodiment 1, wherein the hole transport material is functionalized with at least one perfluoro or at least one semi-fluoro alkyl chain or aryl group.
5. The composition of embodiment 1, wherein the hole transporting material has a molecular weight of about 2,000 g/mol or less.
6. The composition of embodiment 1, wherein the hole transport material is a crosslinkable hole transport material.
7. The composition of embodiment 1, wherein the composition comprises at least two hole transport materials.
8. The composition of embodiment 1, wherein the hole transport material and the hole injection material do not undergo charge transfer with mixing.
9. The composition of embodiment 1, wherein the hole injection material comprises a conjugated polymer.
10. The composition of embodiment 1, wherein the hole injection material comprises at least one arylamine polymer.
11. The composition of embodiment 1, wherein the hole injection material comprises at least one polythiophene.
12. The composition of embodiment 1, wherein the hole injection material comprises at least one regioregular polythiophene.
13. The method of embodiment 1, wherein the hole injection material comprises at least one 3-substituted alkoxypolythiophene or a 3,4-substituted dialkoxypolythiophene.
14. The composition of embodiment 1, wherein the hole injection material comprises at least one polythiophene comprising alkoxy side groups.
15. The method of embodiment 1, wherein the hole injection material comprises poly(3,4-(dibutoxyethoxyethoxy)thiophene.
16. The composition of embodiment 1, wherein the solvent system comprises at least two different solvents, and the hole injection material, the hole transporting material, and the solvent system are adapted so that the hole injection material precipitates earlier than the hole transport material upon removal of the solvent system.
17. The composition of embodiment 1, wherein the solvent system comprises at least one polar solvent and at least one aromatic solvent.
18. The composition of embodiment 1, wherein the solvent system comprises at least two different solvents, and the hole injection material, the hole transporting material, and the solvent system are adapted so that the hole injection material precipitates earlier than the hole transport material upon removal of the solvent system, wherein the hole transporting material is functionalized with a polar moiety.
19. The composition of embodiment 1, wherein the solvent system comprises at least two different solvents, and the hole injection material, the hole transporting material, and the solvent system are adapted so that the hole injection material precipitates earlier than the hole transport material upon removal of the solvent system, wherein the hole transporting material is functionalized with a salt moiety.
20. The composition of embodiment 1, wherein the substrate is a flexible substrate.
21. A method comprising: providing at least one substrate comprising at least one base substrate and at least one transparent (or other) conductive electrode; providing a liquid ink composition, the composition comprising at least one hole injection material and at least one hole transporting material different than the hole injection material; coating the ink composition onto the at least one electrode; drying the ink composition to form at least one film on the electrode, wherein the ink is adapted so that when it dries the film comprises at least one lower first layer disposed on the electrode, and at least one upper second layer different from the first layer and disposed away from the electrode, wherein the first layer is enriched with the at least one hole injection material, and the second layer is enriched with the at least one hole transporting material.
22. The method of embodiment 21, wherein the hole transporting material comprises a structure represented by HTG-SAG, wherein HTG is a hole transporting group, and SAG is a surface active group.
23. The method of embodiment 21, wherein the hole transporting material comprises a structure represented by HTG-SAG, wherein HTG is a hole transporting group, and SAG is a surface active group comprising at least one fluoro substituent.

24. The method of embodiment 21, wherein the hole transporting material comprises a structure represented by HTG-SAG, wherein HTG is a hole transporting group, and SAG is a surface active group comprising at least one alkyl substituent.

25. The method of embodiment 21, wherein the hole transporting material comprises a structure represented by HTG-SAG, wherein HTG is a hole transporting group, and SAG is a surface active group comprising at least one siloxyl substituent.

26. The method of embodiment 21, wherein the hole transporting material comprises at least one fluorinated alkyl group.

27. The method of embodiment 21, wherein the hole transporting material comprises at least two fluorinated alkyl groups.

28. The method of embodiment 21, wherein the hole transporting material comprises at least one trifluoromethyl group.

29. The method of embodiment 21, wherein the hole transporting material comprises at least one hydrogen bonding group.

30. The method of embodiment 21, wherein the hole transporting material comprises at least one hydroxyl group.

31. The method of embodiment 21, wherein the hole transporting material comprises at least one ionic or acidic group.

32. The method of embodiment 21, wherein the hole transporting material comprises at least one ammonium group.

33. The method of embodiment 21, wherein the hole transporting material comprises an arylamine compound.

34. The method of embodiment 21, wherein the hole transporting material comprises at least one thiophene ring.

35. The method of embodiment 21, wherein the hole transporting material has a molecular weight of less than about 5,000 g/mol.

36. The method of embodiment 21, wherein the hole transporting material has a molecular weight of less than about 2,000 g/mol.

37. The method of embodiment 21, wherein the hole transporting material has a molecular weight of less than about 1,000 g/mol.

38. The method of embodiment 21, wherein the ink further comprises a first solvent and a second solvent, and the conjugated polymer has a higher solubility in the first solvent than in the second solvent, the hole transporting compound has a higher solubility in the second solvent than in the first solvent, and the first solvent is removed at a faster rate than the second solvent during the drying step.

39. The method of embodiment 21, wherein the film has greater than 90% transmission at a thickness of 100 nm for radiation between 380-800 nm wavelength.

40. The method of embodiment 21, wherein the second layer has a mobility of $10^{-3}$ $cm^2V^{-1}s^{-1}$ to $10^{-6}$ $cm^2V^{-1}s^{-1}$.

41. The method of embodiment 21, wherein the second layer comprises at least 50% of the hole transporting compound.

42. The method of embodiment 21, wherein the hole transporting material comprises N4,N4'-bis(4-tidecafluorononyloxyphenyl)-N4,N4'-diphenyl-[1,1'-biphenyl]-4,4'-diamine; or N4,N4'-bis(4-vinylphenyl)-N4,N4'-diphenyl-[1,1'-biphenyl]-4,4'-diamine; or poly(9,9-dioctyl-fluorene-co-N-(4-butylphenyl)-diphenylamine.

43. The method of embodiment 21, wherein the first layer comprises at least 50% of the at least one hole injection material.

44. The method of embodiment 21, wherein the hole injection material comprises a conjugated polymer.

45. The method of embodiment 21, wherein the hole injection material comprises at least one 3-substituted alkoxypolythiophene or a 3,4-substituted dialkoxypolythiophene.

46. The method of embodiment 21, wherein the drying step comprises annealing the film.

47. The method of embodiment 21, wherein the hole transporting compound is undoped.

48. The method of embodiment 21, further comprising: forming an emitter layer over the film; and forming a second electrode over the emitter layer.

49. The method of embodiment 21, wherein the second layer does not comprise an emitting layer.

50. The method of embodiment 21, wherein the hole transporting material is a polymer.

51. A method of making a fluid ink composition, comprising: providing at least one solvent; providing at least one hole injection material to the solvent; optionally providing to the solvent at least one matrix material different than the hole injection material; providing to the solvent at least one dopant for the hole injection material, wherein the dopant does not substantially dope the optional matrix material, and the dopant comprises an ionic compound; and providing to the solvent at least one hole transporting compound different from the hole injection material and the matrix material, wherein the hole transporting compound has a structure represented by HTG-SAG, wherein HTG is a hole transporting group, and SAG is a surface active group or a polar group.

52. The method of embodiment 51, wherein the hole transporting compound is a polymer.

53. The method of embodiment 51, wherein the hole transporting compound has a molecular weight of less than 5,000 g/mol.

54. The method of embodiment 51, wherein the SAG is a surface active group.

55. The method of embodiment 51, wherein the hole transporting compound comprises a fluorinated hole transporting compound.

56. The method of embodiment 51, wherein the hole injection material comprises a conjugated polymer.

57. The method of embodiment 51, wherein the hole injection material comprises a conjugated polythiophene polymer.

58. The method of embodiment 51, wherein the hole injection material comprises at least one 3-substituted alkoxypolythiophene or a 3,4-substituted dialkoxypolythiophene.

59. The method of embodiment 51, wherein the hole transporting compound is undoped.

60. The method of embodiment 51, wherein the hole transporting compound is a polymer.

61. The method of embodiment 51, wherein the solvent comprises a first solvent and a second solvent, the hole injection material has a higher solubility in the first solvent than in the second solvent, the hole transporting compound has a higher solubility in the second solvent than in the first solvent.

62. The method of embodiment 51, wherein the composition is formulated to be capable of vertically phase separating.

63. A device prepared with use of the composition of embodiment 1.

64. A method comprising: providing at least one substrate; providing a liquid ink composition, the composition comprising at least one hole injection material and at least one hole transporting material different than the hole injection material; coating the ink composition onto the substrate; drying the ink composition to form at least one film on the substrate, wherein the ink is adapted so that when it dries the film comprises at least one lower first layer disposed on the electrode, and at least one upper second layer different from the first layer and disposed away from the electrode, wherein the first layer is enriched with the at least one hole injection material, and the second layer is enriched with the at least one hole transporting material.

Additional embodiments include, for example:

1a. A composition comprising: a first semiconducting organic material (SOM 1); a second semiconducting organic material (SOM 2) different from the SOM 1; at least one solvent system, wherein the SOM 1 and the SOM 2 are selected from the group consisting of (a) at least one hole injection material (HIM) and at least one hole transporting material (HTM) which is different than the hole injection material, (b) at least one first hole transporting material (HTM 1) and at least one second hole transporting material (HTM 2) which is different from the first hole transport material, or (c) at least one emissive material (EM) and at least one electron transporting material (ETM), respectively, and wherein the SOM 2 is functionalized to encourage surface enrichment of the SOM 2 away from a substrate when the solvent system is removed and a film is formed on the substrate.

2a. The composition of embodiment 1a, wherein the SOM 2 is functionalized with at least one perfluoro or at least one semi-fluoro alkyl chain or aryl group.

3a. The composition of embodiment 1a, wherein the SOM 2 has a molecular weight of about 2,000 g/mol or less.

4a. The composition of embodiment 1a, wherein the SOM 2 is a crosslinkable material.

5a. The composition of embodiment 1a, wherein the SOM 1 and the SOM 2 do not undergo charge transfer with mixing.

6a. The composition of embodiment 1a, wherein the solvent system comprises at least two different solvents, and the SOM 1, the SOM 2, and the solvent system are adapted so that the SOM 1 precipitates earlier than the SOM 2 upon removal of the solvent system.

7a. The composition of embodiment 1a, wherein the solvent system comprises at least one polar solvent and at least one aromatic solvent.

8a. The composition of embodiment 1a, wherein the solvent system comprises at least two different solvents, and the SOM 1, the SOM 2, and the solvent system are adapted so that the SOM 1 precipitates earlier than the SOM 2 upon removal of the solvent system, wherein the SOM 2 is functionalized with a polar moiety.

9a. The composition of embodiment 1a, wherein the solvent system comprises at least two different solvents, and the SOM 1, the SOM 2, and the solvent system are adapted so that the SOM 1 precipitates earlier than the SOM 2 upon removal of the solvent system, wherein the SOM 2 is functionalized with a salt moiety.

10a. The composition of embodiment 1a, wherein the substrate is a flexible substrate.

11a. The composition of embodiment 1a, wherein the SOM 1 is a hole injection material (HIM) and the SOM 2 is a hole transporting material (HTM) different from the hole injection material.

12a. The composition of embodiment 11a, wherein the hole transporting material is an arylamine.

13a. The composition of embodiment 11a, wherein the hole transport material is functionalized with at least one fluorinated group, at least one alkyl group, and/or at least one siloxyl group.

14a. The composition of embodiment 11a, wherein the hole transport material is functionalized with at least one perfluoro or at least one semi-fluoro alkyl chain or aryl group.

15a. The composition of embodiment 11a, wherein the composition comprises N4,N4'-bis(4-tidecafluorononyloxyphenyl)-N4,N4'-diphenyl-[1,1'-biphenyl]-4,4'-diamine; or N4,N4'-bis(4-vinylphenyl)-N4,N4'-diphenyl-[1,1'-biphenyl]-4,4'-diamine; or poly(9,9-dioctyl-fluorene-co-N-(4-butylphenyl)-diphenylamine.

16a. The composition of embodiment 11a, wherein the hole injection material comprises a conjugated polymer.

17a. The composition of embodiment 11a, wherein the hole injection material comprises at least one arylamine polymer.

18a. The composition of embodiment 11a, wherein the hole injection material comprises at least one polythiophene.

19a. The composition of embodiment 11a, wherein the hole injection material comprises at least one regioregular polythiophene.

20a. The composition of embodiment 11a, wherein the hole injection material comprises at least one 3-substituted alkoxypolythiophene or a 3,4-substituted dialkoxypolythiophene.

21a. The composition of embodiment 1a, wherein the SOM 1 and the SOM 2 are at least one first hole transporting material (HTM 1) and at least one second hole transporting material (HTM 2), different from the first hole transport material, respectively.

22a. The composition of embodiment 21a, wherein the HTM 2 has a higher triplet energy than the HTM 1.

23a. The composition of embodiment 21a, wherein the HTM 2 has a triplet energy greater than 2.7 eV and the HTM 1 has a triplet energy less than or equal to 2.7 eV.

24a. The composition of embodiment 21a, wherein the HTM 1 is an arylamine.

25a. The composition of embodiment 21a, wherein the HTM 2 is an arylamine.

26a. The composition of embodiment 21a, wherein the HTM 1 is functionalized with at least one perfluoro or at least one semi-fluoro alkyl chain or aryl group.

31a. The composition of embodiment 1a, wherein the SOM 1 and the SOM 2 are at least one emissive material (EM) and at least one electron transporting material (ETM) respectively.

32a. The composition of embodiment 31a, wherein the ETM is functionalized with at least one perfluoro or at least one semi-fluoro alkyl chain or aryl group.

33a. The composition of embodiment 31a, wherein the ETM is an optionally substituted phenanthroline.

41a. A method comprising: providing at least one substrate comprising at least one base substrate, at least one conductive electrode, and optionally one or more layers comprising at least one semiconducting organic material; providing a liquid ink composition, the composition comprising a first semiconducting organic material (SOM 1) and a second semiconducting organic material (SOM 2) different from the SOM 1; coating the ink composition onto the at least one electrode or, optionally, one or more layers comprising at least one semiconducting organic material; drying the ink composition to form at least one film on the electrode or the layer comprising at least one semiconducting organic material, wherein the ink is adapted so that when it dries the film comprises at least one lower first layer disposed on the electrode or layer comprising at least one semiconducting organic material, and at least one upper second layer different from the first layer and disposed away from the electrode or layer comprising at least one semiconducting organic material, wherein the first layer is enriched with the SOM 1, and the second layer is enriched with the SOM 2, wherein the SOM 1 and the SOM 2 are selected from the group consisting of (a) at least one hole injection material (HIM) and at least one hole transporting material (HTM) which is different from the hole injection material, (b) at least one first hole transporting material (HTM 1) and at least one second hole transporting material (HTM 2) which is different than the first hole transporting material, or (c) at least one emissive material (EM) and at least one electron transporting material (ETM), respectively.

42a. The method of embodiment 41a, wherein the SOM 2 comprises a structure represented by SOM 2-SAG, wherein SAG is a surface-active group.

43a. The method of embodiment 41a, wherein the SOM 2 comprises a structure represented by SOM 2-SAG, wherein SAG is a surface-active group comprising at least one fluoro substituent.

44a. The method of embodiment 41a, wherein the SOM 2 comprises a structure represented by SOM 2-SAG, wherein SAG is a surface-active group comprising at least one alkyl substituent.

45a. The method of embodiment 41a, wherein the SOM 2 comprises a structure represented by SOM 2-SAG, wherein SAG is a surface-active group comprising at least one siloxyl substituent.

46a. The method of embodiment 41a, wherein the SOM 2 comprises at least one fluorinated alkyl group.

47a. The method of embodiment 41a, wherein the SOM 2 comprises at least two fluorinated alkyl groups.

48a. The method of embodiment 41a, wherein the SOM 2 comprises at least one trifluoromethyl group.

49a. The method of embodiment 41a, wherein the SOM 2 comprises at least one hydrogen-bonding group.

50a. The method of embodiment 41a, wherein the SOM 2 comprises at least one hydroxyl group.

51a. The method of embodiment 41a, wherein the SOM 2 comprises at least one ionic or acidic group.

52a. The method of embodiment 41a, wherein the SOM 2 comprises at least one ammonium group.

53a. The method of embodiment 41a, wherein the SOM 2 comprises an arylamine or phenanthroline compound.

54a. The method of embodiment 41a, wherein the SOM 2 has a molecular weight of less than about 5,000 g/mol.

55a. The method of embodiment 41a, wherein the SOM 2 has a molecular weight of less than about 2,000 g/mol.

56a. The method of embodiment 41a, wherein the SOM 2 has a molecular weight of less than about 1,000 g/mol.

57a. The method of embodiment 41a, wherein the ink further comprises a first solvent and a second solvent, and the SOM 1 has a higher solubility in the first solvent than in the second solvent, the SOM 2 has a higher solubility in the second solvent than in the first solvent, and the first solvent is removed at a faster rate than the second solvent during the drying step.

58a. The method of embodiment 41a, wherein the film has greater than 90% transmission at a thickness of 100 nm for radiation between 380-800 nm wavelength.

59a. The method of embodiment 41a, wherein the second layer comprises greater than 50% of the SOM 2.

60a. The method of embodiment 41a, wherein the first layer comprises greater than 50% of the SOM 1.

61a. The method of embodiment 41a, wherein the drying step comprises annealing the film.

62a. The method of embodiment 41a, wherein the SOM 1 and the SOM 2 are at least one hole injection material (HIM) and at least one hole transporting material (HTM) respectively, and further comprises forming an emitter layer over the film, and forming a second electrode over the emitter layer.

63a. The method of embodiment 41a, wherein the SOM 1 and the SOM 2 are at least one hole injection material (HIM) and at least one hole transporting material (HTM) respectively, and the second layer does not comprise an emitting layer.

64a. The method of embodiment 41a, wherein the SOM 1 and the SOM 2 are at least one hole injection material (HIM) and at least one hole transporting material (HTM) respectively, and the hole injection material comprises at least one 3-substituted alkoxypolythiophene or a 3,4-substituted dialkoxypolythiophene.

65a. The method of embodiment 41a, wherein the SOM 1 and the SOM 2 are at least one first hole transporting material (HTM 1) and at least one second hole transporting material (HTM 2) respectively, and the HTM 2 has a triplet energy greater than 2.7 eV and the HTM 1 has a triplet energy less than or equal to 2.7 eV.

66a. The method of embodiment 41a, wherein the SOM 1 and the SOM 2 are at least one first hole transporting material (HTM 1) and at least one second hole transporting material (HTM 2) respectively, and the substrate comprises one or more layers comprising at least one semiconducting organic material.

67a. The method of embodiment 41a, wherein the SOM 1 and the SOM 2 are at least one first hole transporting material (HTM 1) and at least one second hole transporting material (HTM 2) respectively, and the first and second hole transporting materials are arylamines.

68a. The method of embodiment 41a, wherein the SOM 1 and the SOM 2 are at least one emissive material (EM) and at least one electron transporting material (ETM) respectively, and the substrate comprises one or more layers comprising at least one semiconducting organic material.

69a. The method of embodiment 41a, wherein the SOM 1 and the SOM 2 are at least one emissive material (EM) and at least one electron transporting material (ETM) respectively, and the ETM is a phenanthroline.

70a. The method of embodiment 41a, wherein the SOM 1 and the SOM 2 are at least one emissive material (EM) and at least one electron transporting material (ETM) respectively, and the EM does not comprise a hole transporting material.

71a. A method of making a liquid ink composition, comprising: providing at least one solvent; providing a first semiconducting organic material (SOM 1) to the solvent; optionally providing to the solvent at least one matrix material different than the SOM 1; optionally providing to the solvent at least one dopant for the SOM 1, wherein the dopant does not substantially dope the optional matrix material, and the dopant comprises an ionic compound; and providing to the solvent a second semiconducting organic material (SOM 2) different from the SOM 1 and the matrix material, wherein the SOM 2 has a structure represented by SOM 2-SAG, wherein SAG is a surface active group or a polar group, wherein the SOM 1 and the SOM 2 are selected from the group consisting of (a) at least one hole injection material (HIM) and at least one hole transporting material (HTM), (b) at least one first hole transporting material (HTM 1) and at least one second hole transporting material (HTM 2), or (c) at least one emissive material (EM) and at least one electron transporting material (ETM), respectively.

72a. The method of embodiment 71a, wherein the SOM 1 and the SOM 2 are at least one hole injection material (HIM) and at least one hole transporting material (HTM) respectively.

73a. The method of embodiment 71a, wherein the SOM 1 and the SOM 2 are at least one first hole transporting material (HTM 1) and at least one second hole transporting material (HTM 2) respectively.

74a. The method of embodiment 71a, wherein the SOM 1 and the SOM 2 are at least one emissive material (EM) and at least one electron transporting material (ETM) respectively.

75a. The method of embodiment 72a, wherein the hole-transporting compound comprises a fluorinated hole-transporting compound.

76a. The method of embodiment 72a, wherein the hole injection material comprises at least one 3-substituted alkoxypolythiophene or a 3,4-substituted dialkoxypolythiophene.

77a. The method of embodiment 72a, wherein the hole transporting material is an arylamine.

78a. The method of embodiment 73a, wherein the HTM 2 has a triplet energy greater than 2.7 eV and the HTM 1 has a triplet energy less than or equal to 2.7 eV.

79a. The method of embodiment 73a, wherein the first and second hole transporting materials are arylamines.

80a. The method of embodiment 74a, wherein the ETM is a phenanthroline.

81a. The method of embodiment 71a, wherein the composition is formulated to be capable of vertically phase separating.

82a. A device prepared with use of the composition of any one of embodiments 1a to 33a.

83a. A method comprising: providing at least one substrate; providing a liquid ink composition, the composition comprising at least one first semiconducting organic material (SOM 1) and at least one second semiconducting organic material (SOM 2) different from the SOM 1; coating the ink composition onto the substrate; drying the ink composition to form at least one film on the substrate, wherein the ink is adapted so that when it dries the film comprises at least one lower first layer disposed on the substrate, and at least one upper second layer different from the first layer and disposed away from the substrate, wherein the first layer is enriched with the at least one SOM 1, and the second layer is enriched with the at least one SOM 2, and wherein the SOM 1 and the SOM 2 are selected from the group consisting of (a) at least one hole injection material (HIM) and at least one hole transporting material (HTM) which is different than the hole injection material, (b) at least one first hole transporting material (HTM 1) and at least one second hole transporting material (HTM 2) which is different than the first hole transport material, or (c) at least one emissive material (EM) and at least one electron transporting material (ETM), respectively.

84a. The method of embodiment 83a, wherein the SOM 1 and the SOM 2 are at least one hole injection material (HIM) and at least one hole transporting material (HTM) respectively.

85a. The method of embodiment 83a, wherein the SOM 1 and the SOM 2 are at least one first hole transporting material (HTM 1) and at least one second hole transporting material (HTM 2) respectively.

86a. The method of embodiment 83a, wherein the SOM 1 and the SOM 2 are at least one emissive material (EM) and at least one electron transporting material (ETM) respectively.

What is claimed is:

1. A composition comprising:
a first semiconducting organic material (SOM 1);
a second semiconducting organic material (SOM 2) different from the SOM 1;
at least one solvent system,
wherein the SOM 1 is a hole injection material (HIM) and the SOM 2 is a hole transporting material (HTM) different from the hole injection material,
wherein the SOM 2 is functionalized to encourage surface enrichment of the SOM 2 away from a substrate when the solvent system is removed and a film is formed on the substrate,
wherein the SOM 2 comprises N4,N4'-bis(4-tridecafluorononyloxyphenyl)-N4,N4'-diphenyl-[1,1'-biphenyl]-4,4'-diamine.

2. The composition of claim 1, wherein the SOM 1 and the SOM 2 do not undergo charge transfer with mixing.

3. The composition of claim 1, wherein the solvent system comprises at least one polar solvent and at least one aromatic solvent.

4. The composition of claim 1, wherein the solvent system comprises at least two different solvents, and the SOM 1, the SOM 2, and the solvent system are adapted so that the SOM 1 precipitates earlier than the SOM 2 upon removal of the solvent system.

5. The composition of claim 1, wherein the substrate is a flexible substrate.

6. The composition of claim 1, wherein the hole injection material comprises a conjugated polymer.

7. The composition of claim 1, wherein the hole injection material comprises at least one arylamine polymer.

8. The composition of claim 1, wherein the hole injection material comprises at least one polythiophene.

9. The composition of claim 1, wherein the hole injection material comprises at least one regioregular polythiophene.

10. The composition of claim 1, wherein the hole injection material comprises at least one 3-substituted alkoxypolythiophene or a 3,4-substituted dialkoxypolythiophene.

11. A device prepared with use of the composition of claim 1.

12. A method comprising:
providing at least one substrate comprising at least one base substrate, at least one conductive electrode, and optionally one or more layers comprising at least one semiconducting organic material;
providing a liquid ink composition according to claim 1;
coating the ink composition onto the at least one electrode or, optionally, one or more layers comprising at least one semiconducting organic material;
drying the ink composition to form at least one film on the electrode or the layer comprising at least one semiconducting organic material
wherein the ink is adapted so that when it dries the film comprises at least one lower first layer disposed on the electrode or layer comprising at least one semiconducting organic material, and at least one upper second layer different from the first layer and disposed away from the electrode or layer comprising at least one semiconducting organic material, wherein the first layer is enriched with the SOM 1, and the second layer is enriched with the SOM 2.

13. The method of claim 12, wherein the second layer comprises greater than 50% of the SOM 2.

14. The method of claim 12, wherein the first layer comprises greater than 50% of the SOM 1.

15. A method of making a liquid ink composition according to claim 1, comprising:
providing the at least one solvent system;
providing the first semiconducting organic material (SOM 1) to the solvent;
optionally providing to the solvent system at least one matrix material different than the SOM 1;
optionally providing to the solvent system at least one dopant for the SOM 1, wherein the dopant does not substantially dope the optional matrix material, and the dopant comprises an ionic compound; and
providing to the solvent system the second semiconducting organic material (SOM 2) different from the SOM 1 and the matrix material.

16. A method comprising:
providing at least one substrate;
providing a liquid ink composition according to claim 1;
coating the ink composition onto the substrate;

drying the ink composition to form at least one film on the substrate wherein the ink is adapted so that when it dries the film comprises at least one lower first layer disposed on the substrate, and at least one upper second layer different from the first layer and disposed away from the substrate, wherein the first layer is enriched with the at least one SOM 1, and the second layer is enriched with the at least one SOM 2.

17. A composition comprising:

a first semiconducting organic material (SOM 1);

a second semiconducting organic material (SOM 2) different from the SOM 1;

at least one solvent system, wherein the SOM 1 is a hole injection material (HIM) and the SOM 2 is a hole transporting material (HTM) different from the hole injection material, and wherein the SOM 2 is functionalized to encourage surface enrichment of the SOM 2 away from a substrate when the solvent system is removed and a film is formed on a substrate, wherein the SOM 2 is not a crosslinkable material, wherein the hole transport material is functionalized with at least one fluorinated group, and wherein the SOM 2 is functionalized with a salt moiety.

18. The composition of claim 17, wherein the solvent system comprises at least two different solvents, and the SOM 1, the SOM 2, and the solvent system are adapted so that the SOM 1 precipitates earlier than the SOM 2 upon removal of the solvent system.

* * * * *